US010678964B2

(12) United States Patent
Kawai

(10) Patent No.: US 10,678,964 B2
(45) Date of Patent: Jun. 9, 2020

(54) ELECTRIC POWER CONSUMPTION SIMULATION DEVICE, SIMULATION METHOD, AND RECORDING MEDIUM

(75) Inventor: Wakahiro Kawai, Konan (JP)

(73) Assignee: Omron Corporation, Kyoto (JP)

( * ) Notice: Subject to any disclaimer, the term of this patent is extended or adjusted under 35 U.S.C. 154(b) by 1279 days.

(21) Appl. No.: 14/366,227

(22) PCT Filed: Sep. 12, 2012

(86) PCT No.: PCT/JP2012/073307
§ 371 (c)(1),
(2), (4) Date: Jun. 17, 2014

(87) PCT Pub. No.: WO2013/105305
PCT Pub. Date: Jul. 18, 2013

(65) Prior Publication Data
US 2014/0330549 A1 Nov. 6, 2014

(30) Foreign Application Priority Data

Jan. 12, 2012 (JP) .................... 2012-004393
Mar. 12, 2012 (JP) .................... 2012-054996

(51) Int. Cl.
*G06F 30/20* (2020.01)
*G05B 17/02* (2006.01)
*G06Q 50/06* (2012.01)

(52) U.S. Cl.
CPC ............. *G06F 30/20* (2020.01); *G05B 17/02* (2013.01); *G06Q 50/06* (2013.01); *G05B 2219/25387* (2013.01)

(58) Field of Classification Search
CPC .......... G05B 17/02; G05B 2219/25387; G06F 17/5009; G06F 30/20; G06Q 50/06
See application file for complete search history.

(56) References Cited

U.S. PATENT DOCUMENTS

| 8,868,383 | B2 * | 10/2014 | Kubota | .................. G06Q 10/04 700/276 |
| 9,185,241 | B2 * | 11/2015 | Valobra | .............. H04N 1/00031 |
| 2004/0181660 | A1 | 9/2004 | Kato et al. | |
| 2005/0107904 | A1 | 5/2005 | Mikata | |
| 2005/0171753 | A1 | 8/2005 | Rosing et al. | |

(Continued)

FOREIGN PATENT DOCUMENTS

| CN | 1530798 A | 9/2004 |
| CN | 101345420 A | 1/2009 |

(Continued)

OTHER PUBLICATIONS

Extended European Search Report issued in corresponding European Application No. 12865441.5, dated Mar. 1, 2016 (8 pages).

(Continued)

*Primary Examiner* — Aniss Chad
(74) *Attorney, Agent, or Firm* — Osha Liang LLP

(57) ABSTRACT

A simulation apparatus has a type setting section that sets a type of mode of electric power consumption of equipment, and an output section that simulates an amount of the electric power consumption of the equipment in accordance with the type set by the type setting section and outputting the amount of electric power consumption thus simulated.

15 Claims, 23 Drawing Sheets

(56) References Cited

U.S. PATENT DOCUMENTS

| | | | |
|---|---|---|---|
| 2006/0080076 A1* | 4/2006 | Lahiri | G06F 17/5022 703/18 |
| 2010/0235121 A1* | 9/2010 | Constien | H01M 10/488 702/63 |
| 2011/0022212 A1 | 1/2011 | Nonaka et al. | |
| 2011/0138202 A1 | 6/2011 | Inoue et al. | |
| 2011/0153107 A1 | 6/2011 | Kim et al. | |
| 2011/0270452 A1 | 11/2011 | Lu et al. | |
| 2012/0078593 A1 | 3/2012 | Kubota et al. | |
| 2012/0150707 A1* | 6/2012 | Campbell | G06Q 30/04 705/34 |

FOREIGN PATENT DOCUMENTS

| | | |
|---|---|---|
| CN | 102227740 A | 10/2011 |
| EP | 1729223 A2 | 12/2006 |
| JP | 2003-44115 A | 2/2003 |
| JP | 3681994 B2 | 8/2005 |
| JP | 2008-234176 A | 10/2008 |
| JP | 4247083 B2 | 4/2009 |
| JP | 2009-157673 A | 7/2009 |
| JP | 2011-129085 A | 6/2011 |
| JP | 2012-65468 A | 3/2012 |

OTHER PUBLICATIONS

Grant of Patent in counterpart Korean Patent Application No. 10-2014-7016099 dated Aug. 25, 2016 (2 pages).

International Preliminary Report on Patentability issued in PCT/JP2012/073307, dated Jul. 24, 2014 (11 pages).

International Search Report for corresponding International Application No. PCT/JP2012/073307, dated Oct. 23, 2012 (2 pages).

Written Opinion for corresponding International Application No. PCT/JP2012/073307, dated Oct. 23, 2012 (6 pages).

Minami, Y., et al.; "Evaluation of Maximum Electric Power Consumption Reduction Based on use Situations and Power Characterisitics of Home Electronics;" The Insitute of Electronics, Information and Communication Engineers Sogo Taikai Koen Ronbunshu, Mar. 2, 2010 (Mar. 2, 2010), Tsunshin Koen Ronbunshu 2, pp. S-146 to S147 (11 pages).

Office Action issued in corresponding Chinese Application No. 201280061856.9, dated Nov. 18, 2015 (8 pages).

* cited by examiner

F I G. 4
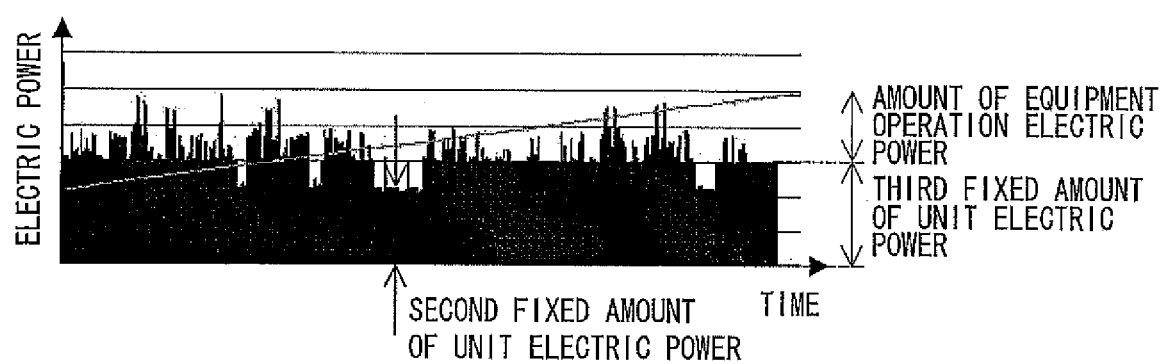

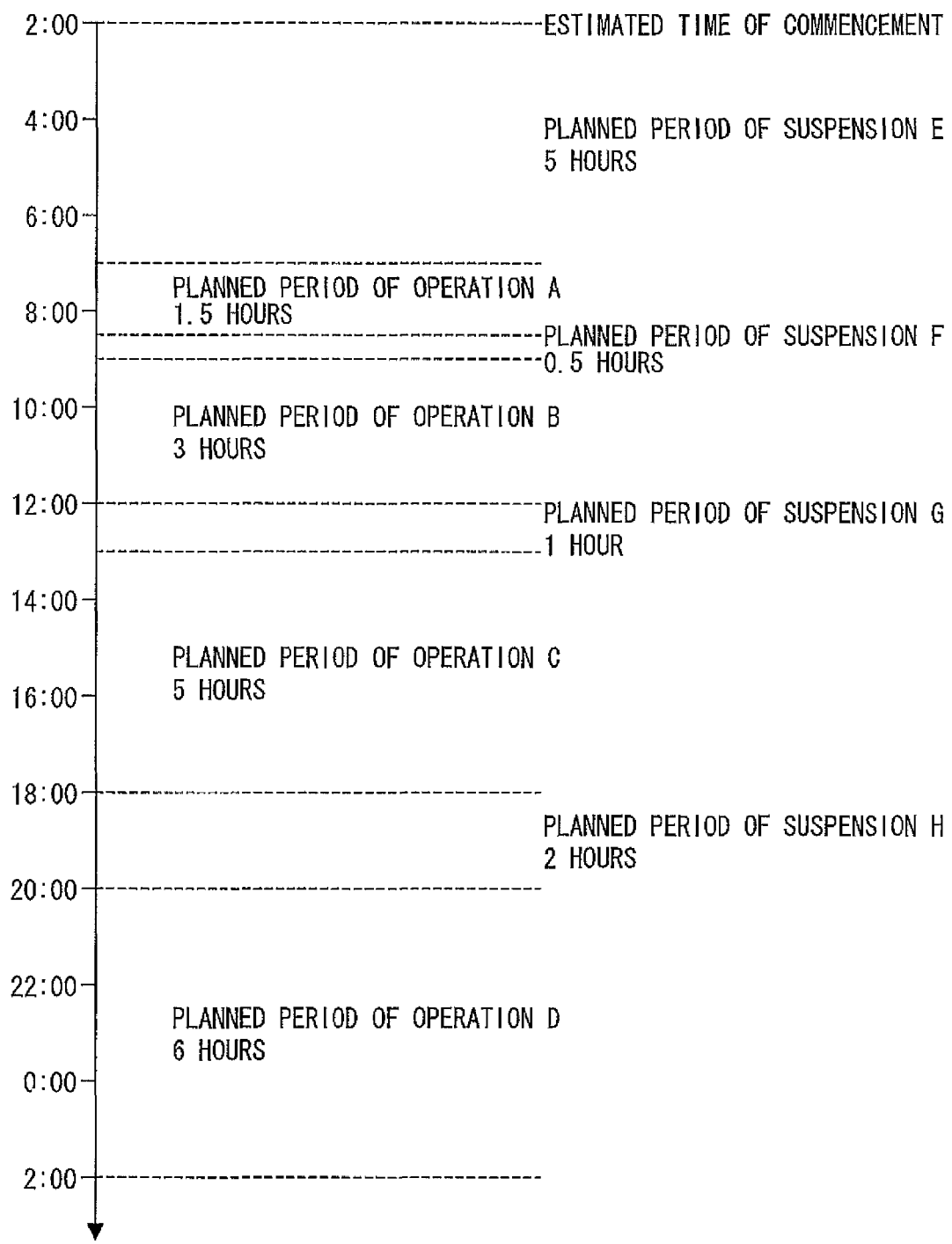

FIG. 11

| EQUIPMENT NAME | NUMBER OF PIECES OF EQUIPMENT | MODE TYPE INFORMATION | EQUIPMENT TYPE INFORMATION | TURN |
|---|---|---|---|---|
| PRINTING MACHINE | 1 | TYPE 1 | LINE | 1 |
| FIRST INSPECTION MACHINE | 1 | TYPE 3 | LINE | 2 |
| HIGH-SPEED PACKAGING MACHINE | 1 | TYPE 2 | LINE | 3 |
| HIGH-PRECISION PACKAGING MACHINE | 1 | TYPE 2 | LINE | 4 |
| SECOND INSPECTION MACHINE | 1 | TYPE 3 | LINE | 5 |
| REFLOW FURNACE | 1 | TYPE 3, 6 | LINE | 6 |
| ILLUMINATOR | 1 | TYPE 3, 5 | LINE | 7 |
| THIRD INSPECTION MACHINE | 1 | TYPE 3 | LINE | 8 |
| COMPRESSOR | 1 | TYPE 3 | SUPPORTING | — |
| EXHAUST DUCT | 1 | TYPE 3 | SUPPORTING | — |
| AIR-CONDITIONING MACHINE | 1 | TYPE 3 | SUPPORTING | — |

FIG. 12

| EQUIPMENT NAME | MODE TYPE INFORMATION | REFERENCE ELECTRIC POWER | UNIT OPERATION ELECTRIC POWER | NUMBER OF OPERATIONS | FIXED AMOUNT OF UNIT ELECTRIC POWER | STANDBY STATE INFORMATION | NUMBER OF WORKPIECES TO BE INPUTTED | MAXIMUM NUMBER OF WORKPIECES TO BE PROCESSED | START-UP TIME | START-UP ELECTRIC POWER | START-UP ELECTRIC POWER TABLE |
|---|---|---|---|---|---|---|---|---|---|---|---|
| PRINTING MACHINE | TYPE 1 | 200 | 1 | 1000 | 20 | | | | | | |
| FIRST INSPECTION MACHINE | TYPE 3 | — | | | 3 | | IGNORED | IGNORED | | | |
| HIGH-SPEED PACKAGING MACHINE | TYPE 2 | 120 | 0.04 | 30000 | SECOND:5 THIRD:7 | PRECEDING SUBSEQUENT | | | | | |
| HIGH-PRECISION PACKAGING MACHINE | TYPE 2 | 150 | 0.06 | 20000 | SECOND:6 THIRD:8 | PRECEDING SUBSEQUENT | | | | | |
| SECOND INSPECTION MACHINE | TYPE 3 | — | | | 3 | | IGNORED | IGNORED | | | |
| REFLOW FURNACE | TYPE 3, 6 | — | | | 50 | | IGNORED | IGNORED | | | |
| ILLUMINATOR | TYPE 3, 5 | — | | | 8 | | | | 30 MINUTES | 10 | TABLE T |
| THIRD INSPECTION MACHINE | TYPE 3 | — | | | 3 | | IGNORED | IGNORED | | | |
| COMPRESSOR | TYPE 3 | — | | | 15 | | — | — | | | |
| EXHAUST DUCT | TYPE 3 | — | | | 10 | | — | — | | | |
| AIR-CONDITIONING MACHINE | TYPE 3 | — | | | AUTOMATIC | | — | — | | | |

REGION A | REGION B

F I G. 1 3

TABLE T

|  | PERIOD OF STOPPAGE | START-UP TIME | START-UP ELECTRIC POWER | POWER-OFF TIME |
|---|---|---|---|---|
| CANNOT BE TURNED OFF | 15 MINUTES | 30 MINUTES | ○○○Kwh | -15 |
|  | 30 MINUTES | 30 MINUTES | ○○○Kwh | 0 |
| CAN BE TURNED OFF | 45 MINUTES | 40 MINUTES | ○○○Kwh | 5 |
|  | 60 MINUTES | 45 MINUTES | ○○○Kwh | 15 |
|  | ⋮ | ⋮ | ⋮ | ⋮ |
|  | 120 MINUTES OR LONGER | 60 MINUTES (MAXIMUM) | ○○○Kwh | 60 OR LONGER |

F I G. 1 4

| TOTAL OF AMOUNTS OF ELECTRIC POWER CONSUMPTION OF PIECES OF LINE EQUIPMENT | RATED ELECTRIC POWER |
|---|---|
| 0 — △△△ | × × × |
|  |  |
| □□□ — ○○○ | × × × × |

F I G. 1 6
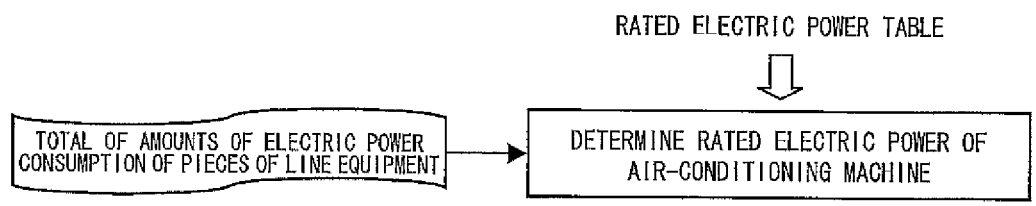

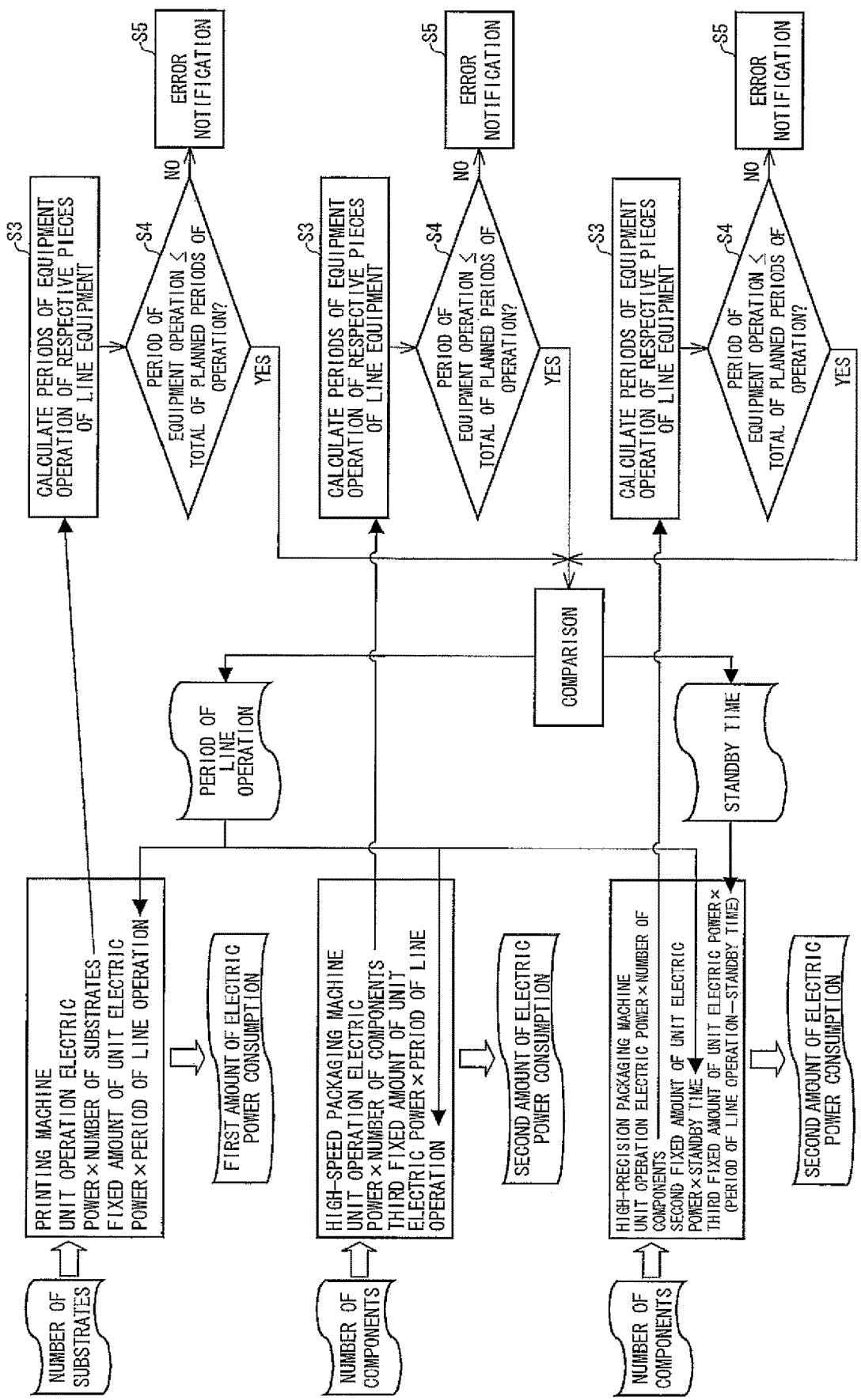
F I G. 17

F I G. 1 8
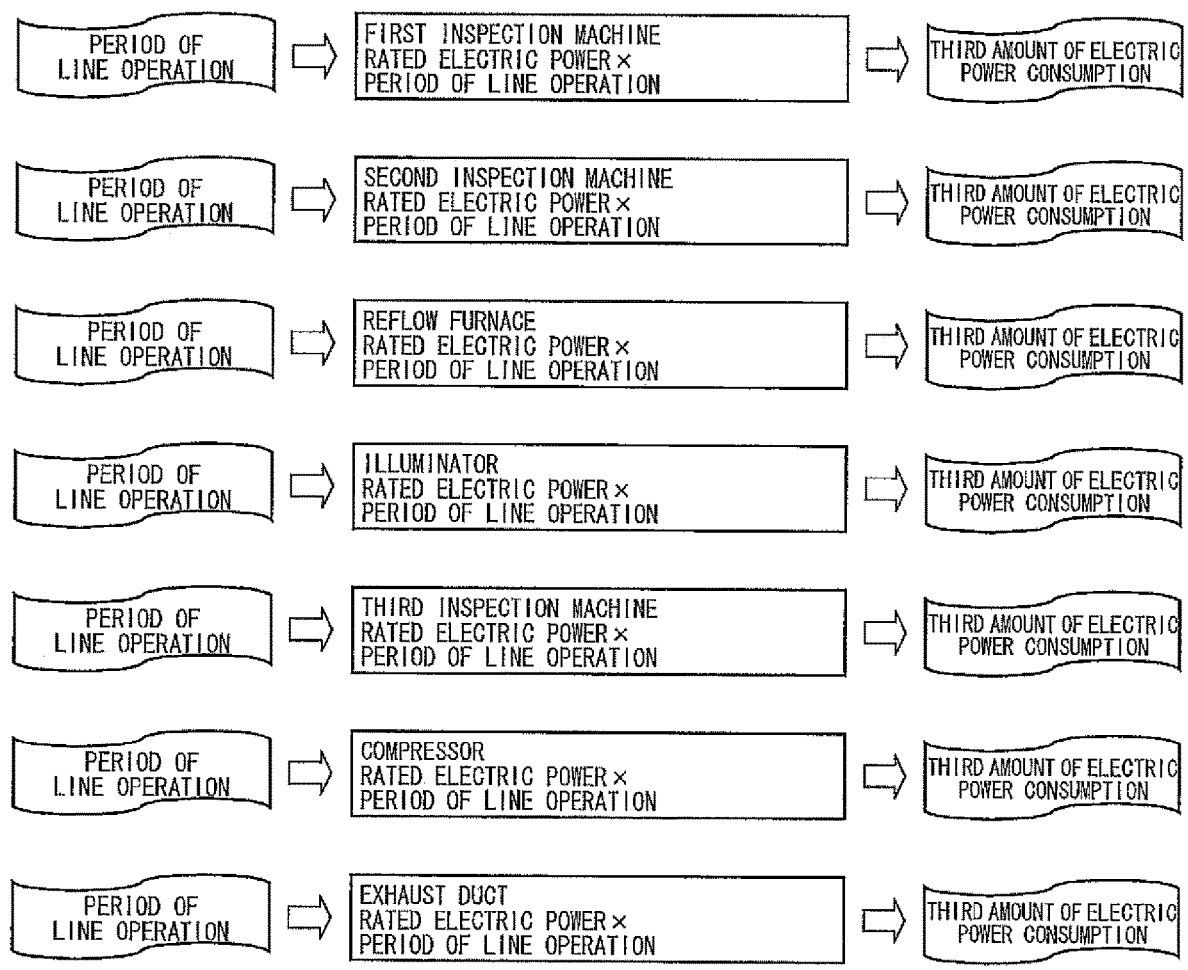

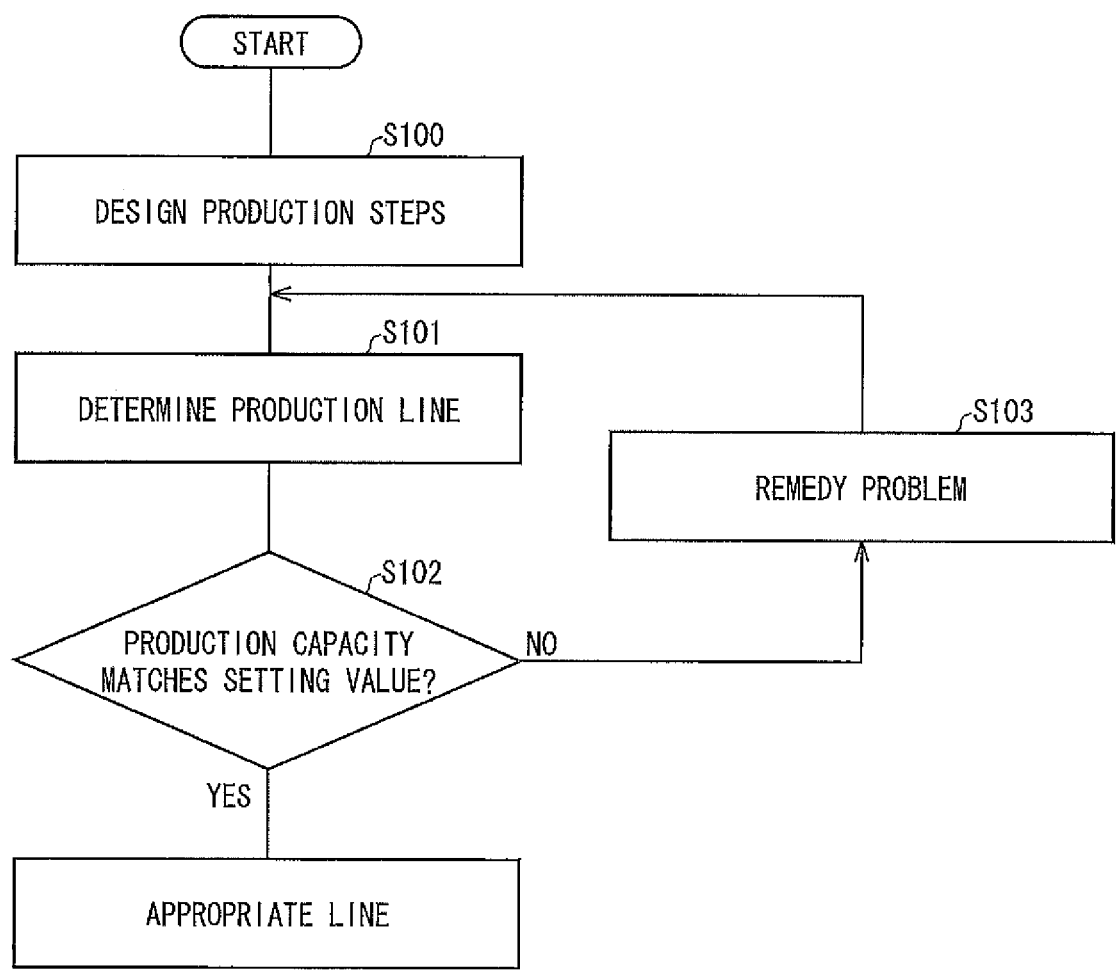
F I G. 2 2

ELECTRIC POWER CONSUMPTION SIMULATION DEVICE, SIMULATION METHOD, AND RECORDING MEDIUM

BACKGROUND

Technical Field

The present invention relates to a simulation apparatus that simulates an amount of electric power consumption of a piece of equipment and outputs the amount of electric power consumption thus simulated.

Related Art

Conventionally, a production line is known, which successively processes or assembles electronic components, mechanical components, or the like with the use of a plurality of pieces of equipment. Such a production line is constructed by a method such as the one shown in FIG. 22. First, production steps are designed based on information such as a material, a shape, and components of a product (S100). Next, a production line is determined by introducing and disposing, in accordance with a production capacity, resources (e.g. pieces of equipment, machine tools, carrying means, and personnel) for achieving the production steps (S101). Then, the production capacity is evaluated while actually producing a product on the production line thus determined (S102). In a case where the production capacity is inferior to that estimated in the design stage, the cause of it is investigated, and some sort of improvement is attempted (S103). In S103, for example, the production line is redesigned. Subsequently, the evaluation in S102 is repeated. By repeating S101 to S103 plural times, an appropriate production line is completed.

However, in a case where a production line is constructed by the method shown in FIG. 22, it takes a lot of labor to achieve optimum collaboration of the pieces of equipment prepared based on the design of the production steps. Moreover, it takes a long time to construct an appropriate production line, for example, because of occurrence of the necessity of redesigning the production steps back at the design process. Furthermore, failure to achieve maximum capacities of the pieces of equipment or failure to accomplish the designed production capacity are likely to occur because of occurrence of a standby time, an idling time, or the like necessitated due to collaboration with the other pieces of equipment.

Patent Literatures 1 through 4 propose a method of evaluating a production line by constructing a virtual model of the production line on a computer on the basis of product specification, production conditions, etc. and simulating an entire operation of the production line with the use of the virtual model. Especially, Patent Literatures 3 and 4 propose a method of simulating an operating state of a production line by intentionally changing an equipment capacity in a virtual model and a method of calculating a rate of operation of a production line by using percentages of operation and suspension of each piece of equipment.

Patent Literature 1

Japanese Patent Application Publication, Tokukai, No. 2003-44115 A (Publication Date: Feb. 14, 2003)

Patent Literature 2

Japanese Patent Application Publication, Tokukai, No. 2008-234176 A (Publication Date: Oct. 2, 2008)

Patent Literature 3

Japanese Patent Publication, No. 4247083 (Publication Date: Apr. 2, 2009)

Patent Literature 4

Japanese Patent Application Publication, Tokukai, No. 2009-157673 A (Publication Date: Jul. 16, 2009)

SUMMARY

Due to the increasing awareness of a $CO_2$ reduction in recent years, there is an increasing need for design which not only shortens a production takt and minimizes a production cost, but also minimizes an amount of electric power consumption. The techniques described in Patent Literatures 1 through 4, however, do not consider electric power consumption.

One example of a method for estimating an amount of electric power consumption of a production line is a method of calculating a total amount of electric power consumption from amounts of rated electric power of pieces of equipment constituting the production line. Specifically, an amount of electric power consumption of a production line is calculated by (i) multiplying, by an inputted planned period, an amount of rated electric power of each piece of equipment constituting the production line and (ii) summing up values thus obtained (see FIG. 23). However, the amount of electric power consumption thus calculated does not take into consideration suspension and standby states of each piece of equipment, and is therefore far larger than an actual amount of electric power consumption of the production line. It may be possible to use percentage of suspension of pieces of equipment as described in Patent Literature 3, but Patent Literature 3 does not take into consideration suspension and standby states of the pieces of equipment arising from collaborative operations of a plurality of pieces of equipment in a production line. Therefore, an improvement in accuracy of a simulation result of an amount of electric power consumption cannot be expected.

Furthermore, there are demands for accurate simulation of amounts of electric power consumption of pieces of equipment not only in a production line but also in a system including a plurality of pieces of equipment operating in association with each other. Examples of such a system encompass a waste disposal system in which a plurality of pieces of equipment sequentially process waste (e.g. industrial waste, industrial wastewater, waste gas, garbage).

One or more embodiments of the present invention provides a simulation apparatus, a simulation method, a program, and a recording medium that can accurately simulate an amount of electric power consumption of a piece of equipment and output the amount of electric power consumption thus simulated.

A simulation apparatus according to one or more embodiments of the present invention includes a type setting section setting a type of mode of electric power consumption of equipment; and an output section simulating an amount of the electric power consumption of the equipment in accordance with the type set by the type setting section and outputting the amount of electric power consumption thus simulated.

According to the simulation apparatus of one or more embodiments of the present invention, it is possible to produce an effect of highly accurately simulating an amount of electric power consumption of a piece of equipment and outputting the amount of electric power consumption thus simulated.

BRIEF DESCRIPTION OF DRAWINGS

FIG. 4 is a view showing an electric power waveform of a high-precision packaging machine that exhibits a mode of electric power consumption of Type 2.

FIG. 10 is a view showing an example of schedule information.

FIG. 11 is a view showing part of virtual model information set by the virtual model building section.

FIG. 12 is a view showing another part of virtual model information set by the virtual model building section.

FIG. 13 is a view showing an example of a start-up electric power table set by the virtual model building section.

FIG. 14 is a view showing an example of a rated electric power table stored in a rating section.

FIG. 16 is a view showing details of S13 of FIG. 15.

FIG. 17 is a view showing a specific example of the processes in S3 to S7 in a case where the virtual model information shown in FIG. 11 and FIG. 12 is set.

FIG. 18 is a view showing a specific example of the process in S8 in a case where the virtual model information shown in FIG. 11 and FIG. 12 is set.

FIG. 22 is a flow chart showing a method for constructing a conventional production line.

DETAILED DESCRIPTION

A simulation apparatus for simulating a production line according to embodiments of the present invention is described below with reference to the drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

<Virtual Model of a Production Line>

Figure 1:
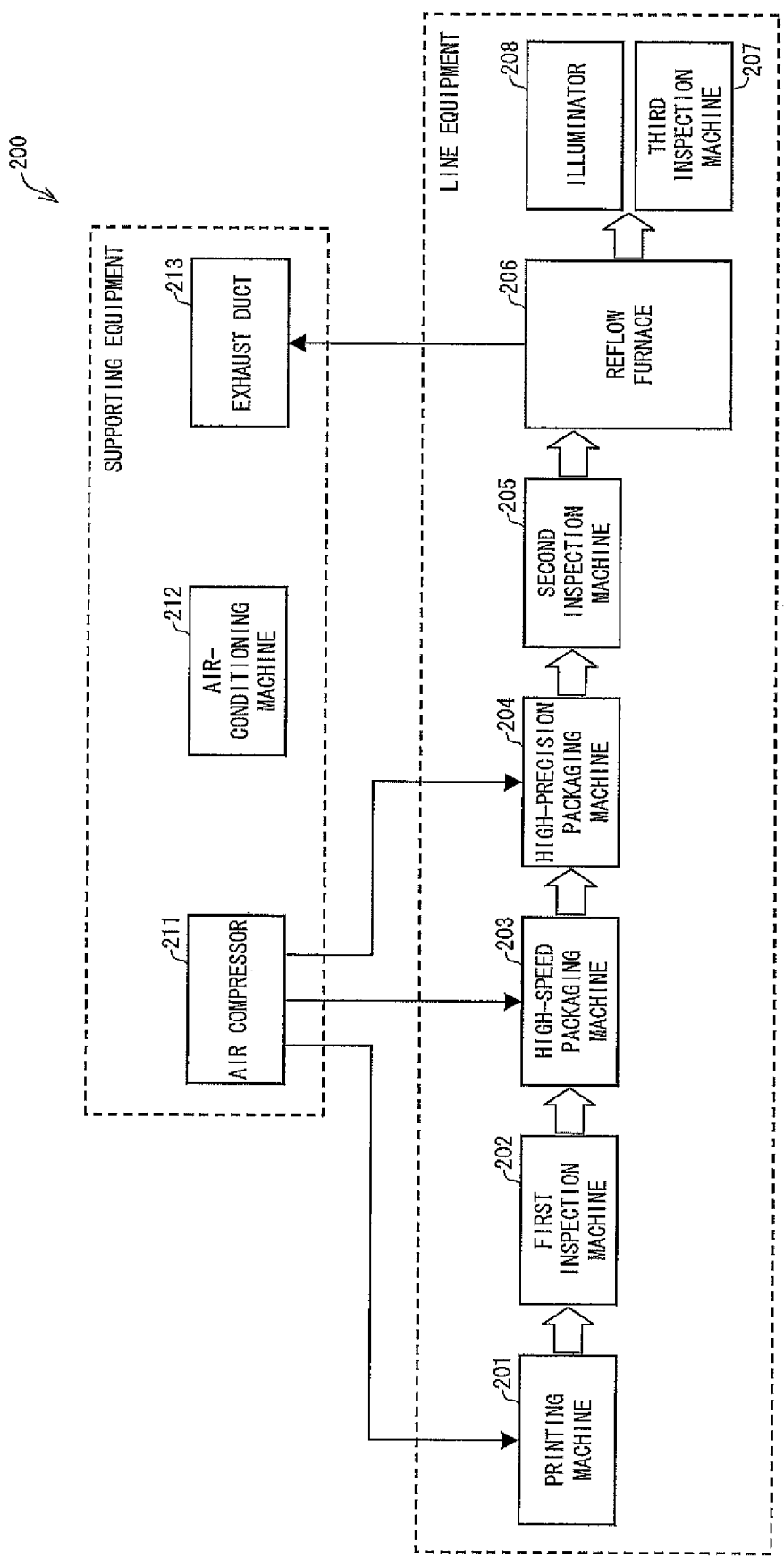
FIG. 1 is a view schematically showing an example of a virtual model of a production line.

FIG. 1 shows an example of a virtual model of a production line as configured by a simulation apparatus according to one or more embodiments of the present invention. As shown in FIG. 1, the virtual model 200 is a model of a production line for fabricating electronic component packaged boards by packaging electronic components onto printed circuit boards.

The virtual model 200 includes: a printing machine 201 for printing soldering material onto a printed circuit board (hereinafter referred to simply as "substrate") (workpiece) serving as a base material for an electronic component packaged board; a high-speed packaging machine 203 and a high-precision packaging machine 204 for packaging electronic components onto the substrate; a reflow furnace 206, in which the solder material is heated and solidified; a first inspection machine 202, a second inspection machine 205, and a third inspection machine 207 for checking the status of processing after the respective steps; and an illuminator 208, which illuminates the workpiece during inspection by the third inspection machine 207. These pieces of equipment are pieces of equipment (hereinafter referred to as "pieces of line equipment") that produce a product by performing processes on the substrate, i.e. the workpiece (object to be processed), on the production line.

The virtual model 200 further includes: an air compressor 211, which supplies compressed air to the printing machine 201, the high-speed packaging machine 203, and the high-precision packaging machine 204; an exhaust duct 213, through which gas from the reflow furnace is exhausted; and an air-conditioning machine 212, which conditions the air in a space for the production line. These pieces of equipment serve as pieces of factory equipment (hereinafter referred to as "pieces of supporting equipment") for supporting the operation of the production line.

As described above, the virtual model 200 of the production line include: the pieces of line equipment, which constitute the production line; and the pieces of supporting equipment, which support the production line.

<Types of Mode of Electric Power Consumption of the Pieces of Equipment>

Modes of electric power consumption of the pieces of line equipment and the pieces of supporting equipment can be categorized into the following six types, namely Types 1 to 6. Types 1, 2, and 4 are modes of electric power consumption in the pieces of line equipment, and Types 3, 5, and 6 are modes of electric power consumption that can be adopted by both the pieces of line equipment and the pieces of supporting equipment. It should be noted there is a piece of equipment that exhibits both either of Types 5 and 6 and any of Types 1 to 4.

(Type 1 (First Type))

Type 1 is a mode of electric power consumption in a piece of line equipment that varies in electric power consumption between an operating state in which it performs a process on a workpiece and a standby state in which it stands by without performing a process on a workpiece. Moreover, Type 1 is a type in which assuming that the amount of electric power that is consumed per unit time in the standby state is a first fixed amount of unit electric power, the amount of electric power that is consumed per unit time in the operating state is greater than the first fixed amount of unit electric power. That the amount of electric consumption in the operating state takes on a value obtained by adding up (i) a fixed amount of equipment electric power calculated by multiplying, by the first fixed amount of unit electric power, an amount of time (period of operation) during which the piece of equipment is operating and (ii) an amount of operating electric power (hereinafter referred to as "equipment operation electric power") required separately from the fixed amount of equipment electric power. It should be noted that the amount of equipment operation electric power can be calculated by multiplying, by the number of times (frequency of an operation) that a predetermined unit operation is performed, an amount of electric power (hereinafter referred to as "unit operation electric power") required separately from the fixed amount of equipment electric power for the target piece of line equipment to perform the unit operation. It should be noted that in Type 1, there is only one standby state.

Figure 2:
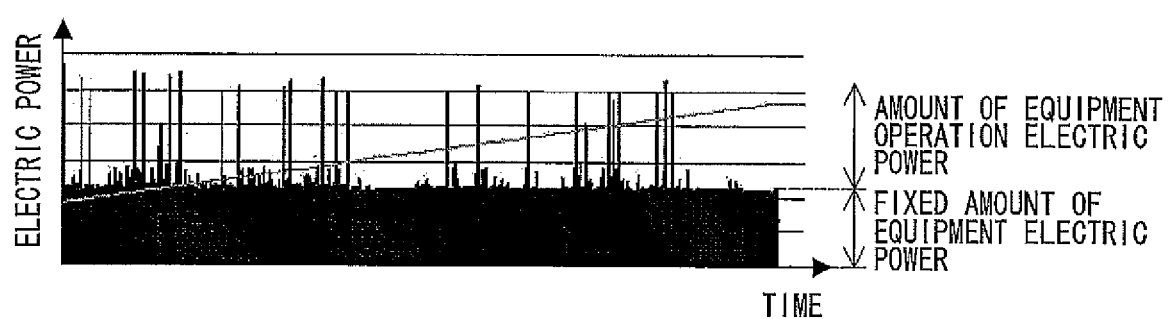
FIG. 2 is a view showing an electric power waveform of a printing machine that exhibits a mode of electric power consumption of Type 1.

In the case of the virtual model 200 shown in FIG. 1, for example, Type 1 is a mode of electric power consumption by the printing machine 201. FIG. 2 shows the mode of electric power consumption by the printing machine 201. As shown in FIG. 2, in the standby state, a fixed amount of equipment electric power is consumed by idle running etc. of a controller and a drive motor. In the operating state, an amount of equipment operation electric power required to perform a printing process of putting solder paste onto the substrate and to perform a cleaning process every time the printing process is performed a predetermined number of times is consumed in addition to the fixed amount of equipment electric power. That is, in the operating state, the sum of the fixed amount of equipment electric power and the amount of equipment operation electric power is consumed.

(Type 2 (Second Type))

As with Type 1 described above, Type 2 is a mode of electric power consumption in a piece of line equipment that varies in electric power consumption between an operating state in which it performs a process on a workpiece and a standby state in which it stands by without performing a process on a workpiece. Note, however, that in Type 2, there exist two standby states, namely a first standby state and a second standby state. In the first standby state, a second fixed amount of unit electric power is consumed per unit time, and in the second standby state, a third fixed amount of unit electric power (which is greater than the second fixed amount of unit electric power) is consumed. The amount of electric power that is consumed in the operating state is the sum of (i) the fixed amount of equipment electric power, which takes on a value obtained by multiplying the third fixed amount of unit electric power by the period of operation, and (ii) the amount of equipment operation electric power.

Figure 3:
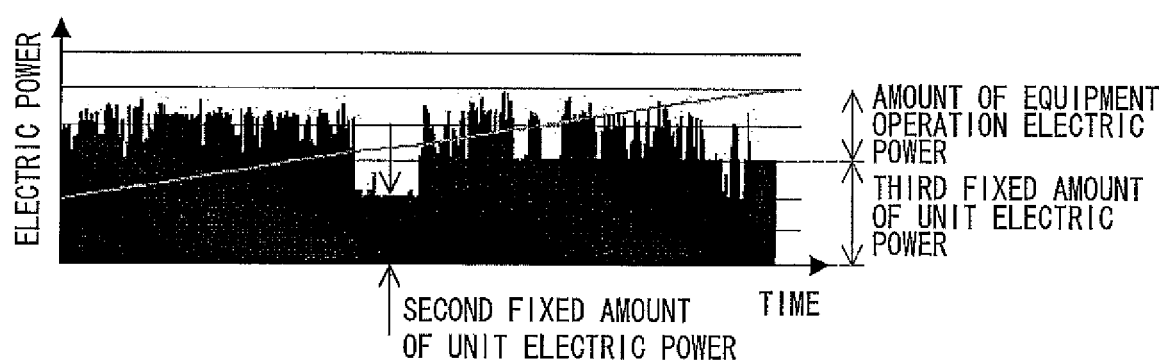
FIG. 3 is a view showing an electric power waveform of a high-speed packaging machine that exhibits a mode of electric power consumption of Type 2.

In the case of the virtual model shown in FIG. 1, for example, Type 2 is a mode of electric power consumption by the high-speed packaging machine 203 or the high-precision packaging machine 204. FIG. 3 shows a mode of electric power consumption by the high-speed packaging machine 203, and FIG. 4 shows a mode of electric power consumption by the high-precision packaging machine 204. As shown in FIG. 3, the high-speed packaging machine 203 has a first standby state in which it consumes a second fixed amount of unit electric power and a second standby state in which it consumed a third fixed amount of unit electric power that is greater than the second fixed amount of unit electric power. Similarly, as shown in FIG. 4, the high-precision packaging machine 204 has a first standby state in which it consumes a second fixed amount of unit electric power and a second standby state in which it consumes a third fixed amount of unit electric power that is greater than the second fixed amount of unit electric power.

For the high-speed packaging machine 203 and the high-precision packaging machine 204, the first standby state is a state in which the machine does not hold a substrate (workpiece) onto which components are to be packaged, but waits for a new substrate to be conveyed from the preceding piece of line equipment. Meanwhile, the second standby state is a state in which the machine cannot pass to the next piece of line equipment a substrate onto which components have been packaged, because the next piece of equipment is still in process, and the machine is therefore waiting while holding the substrate. In this case, an amount of electric power for holding the substrate is required, and the third fixed amount of unit electric power is therefore greater than the second fixed amount of unit electric power.

In the operating state, in which it is necessary to perform a process (packaging process) of holding a substrate and packaging components in predetermined positions on the substrate, the amount of equipment operation electric power required for the packaging process is consumed in addition to an amount of electric power (fixed amount of equipment electric power) calculated by multiplying the third fixed amount of unit electric power by the period of operation.

(Type 3 (Third Type))

Type 3 is a mode of electric power consumption in a piece of equipment that, while the production line is in operation, is kept on and consumes substantially a constant amount of electric power. In a case where this type of piece of equipment is a piece of line equipment, substantially a constant amount of electric power is consumed regardless of a delay in another piece of line equipment (i.e. regardless of the presence or absence of a workpiece being conveyed).

In the case of the virtual model shown in FIG. 1, for example, Type 3 is a mode of electric power consumption of the reflow furnace 206 in a stable state at the preset temperature, of the exhaust duct 213, of the air compressor 211, and of the first to third inspection machines 202, 205, and 207 configured to be always kept on.

Figure 5:
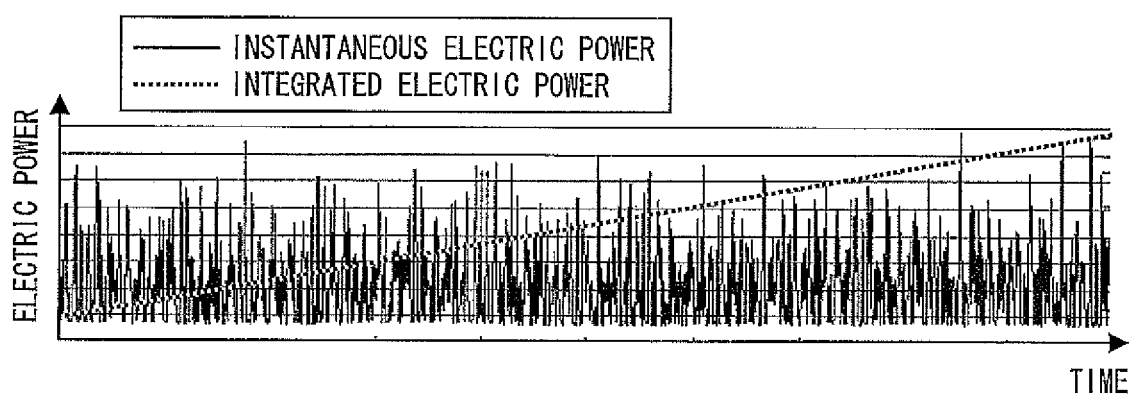
FIG. 5 is a view showing an electric power waveform of a reflow furnace in a stable state that exhibits a mode of electric power consumption of Type 3.

FIG. 5 is a mode of electric power consumption of the reflow furnace 206. It should be noted that FIG. 5 shows a mode of electric power consumption of the reflow furnace 206 in a stable state at the preset temperature. As shown in FIG. 5, substantially a constant amount of electric power is consumed regardless of the presence or absence of a workpiece being conveyed. Usually, such a piece of equipment is systematically kept off only during a period of time, such as a holiday, during which the whole production line is under suspension.

It should be noted that the amount of electric power that is consumed by a piece of equipment that exhibits a mode of electric power consumption belonging to Type 3 can be calculated by multiplying, by the period of operation, a fourth fixed amount of unit electric power that is consumed per unit time by the piece of equipment.

(Type 4 (Fourth Type))

Type 4 is a mode of electric power consumption in a piece of equipment that is turned on in performing a process on a workpiece and that consumes substantially a constant amount of electric power when the power is on.

In the case of the virtual model shown in FIG. 1, for example, Type 4 is a mode of electric power consumption of the first to third inspection machines 202, 205, and 207 configured to be turned on only when used. A worker turns on an inspection machine in carrying out an inspection, and the inspection machine consumes electric power. In a case where the inspection machine is always kept on while the production line is in operation, as well as when an inspection is carried out, the mode of electric consumption is Type 3. That is, a piece of equipment belonging to Type 4 may adopt Type 3, depending on how it is used.

It should be noted that the amount of electric power that is consumed by a piece of equipment belonging to Type 4 can be calculated by multiplying, by the number of times that a predetermined unit operation is performed, the amount of unit operation electric power, i.e. electric power required for the piece of equipment to perform the unit operation.

Figure 6:
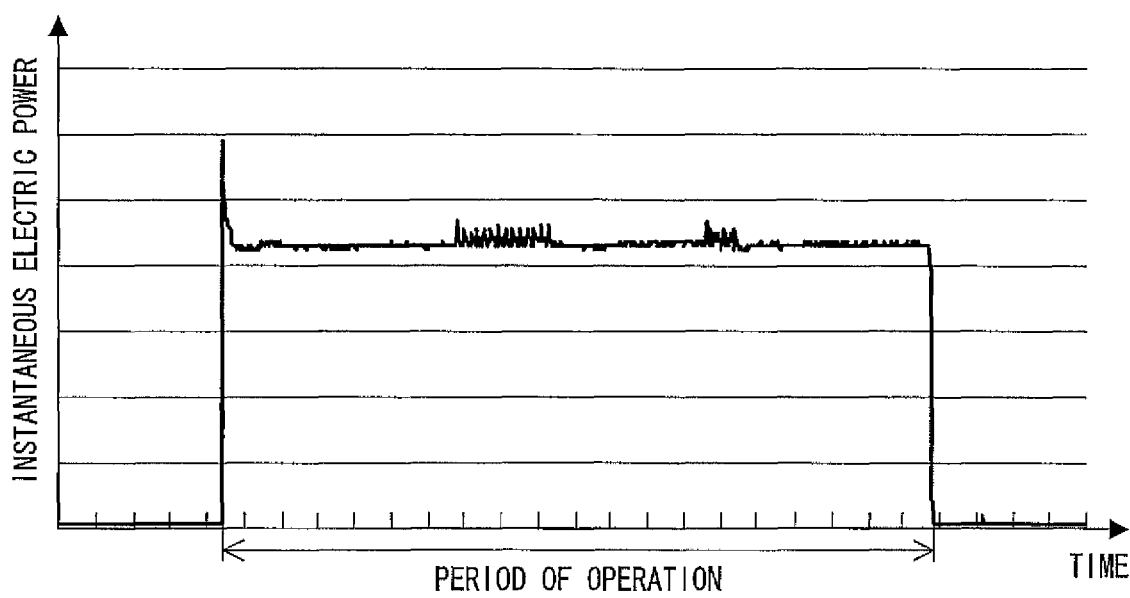
FIG. 6 is a view showing an electric power waveform of an inspection machine that exhibits a mode of electric power consumption of Type 4.

FIG. 6 shows a mode of electric power consumption in the first inspection machine 202. As shown in FIG. 6, substantially a constant amount of electric power is consumed only during the period of operation.

(Type 5 (Fifth Type))

Type 5 is a type of mode of electric power consumption that is adopted when a piece of equipment is started up (activated). In Type 5, substantially a constant amount of electric power is consumed by a start-up regardless of the state in which the piece of equipment was before the start-up.

Type 5 applies to a piece of equipment, such as lighting equipment, whose amount of light takes time to stabilize. In the case of the virtual model shown in FIG. 1, for example, Type 5 is a mode of electric power consumption that is adopted at the time of start-up of the illuminator 208.

Figure 7:
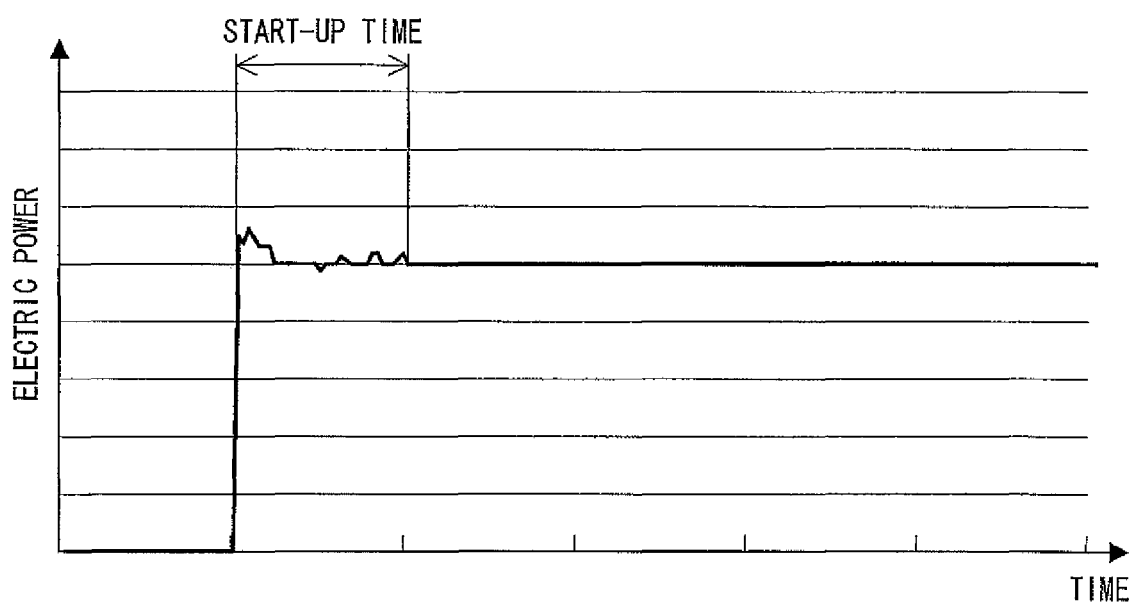
FIG. 7 is a view showing an electric power waveform at the time of start-up of an illuminator that exhibits a mode of electric power consumption of Type 5.

FIG. 7 shows a mode of electric power consumption at the time of start-up of the illuminator 208 included in the virtual model. As shown in FIG. 6, the amount of electric power required for start-up is consumed over a given period of time (approximately 30 minutes) until the amount of illuminating light stabilizes.

(Type 6 (Sixth Type))

As with Type 5, Type 6 is a type of mode of electric power consumption that is adopted when a piece of equipment is started up (activated). However, Type 6 is a mode in which the amount of electric power that is consumed at the time of start-up (hereinafter referred to as "start-up electric power") varies depending on the state in which the piece of equipment was before the start-up.

A mode of electric power consumption belonging to Type 6 is adopted by a heating apparatus such as the reflow furnace 206 of the virtual model shown in FIG. 2. Such a heating apparatus has residual heat in its furnace when kept off for a short period of time, and therefore reaches the preset temperature in less time than it would do if there were no residual heat. The amount of start-up electric power required varies depending on how long the heating apparatus was kept off before the start-up.

Figure 8:
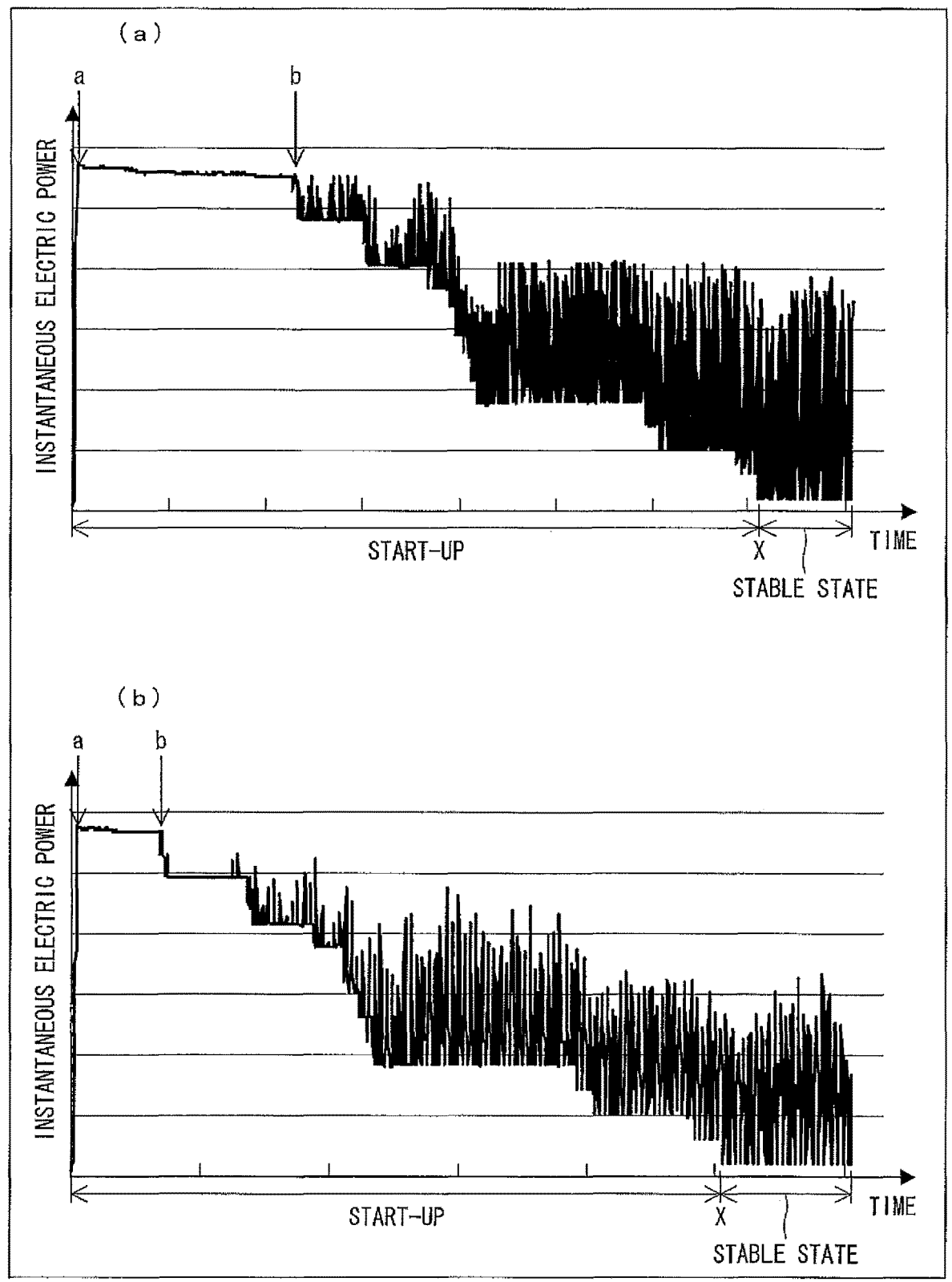
FIG. 8 is a view showing an electric power waveform at the time of start-up of a reflow furnace that exhibits a mode of electric power consumption of Type 6. (a) of FIG. 8 shows a ease where the reflow furnace is started up with no residual heat therein, and (b) of FIG. 8 shows a case where the reflow furnace is started up with residual heat therein.

(a) of FIG. 8 shows a mode of electric power consumption by the reflow furnace 206 started up with no residual heat therein, and (b) of FIG. 8 shows a mode of electric power consumption by the reflow furnace 206 started up with residual heat therein. As shown in (a) and (b) of FIG. 8, a heating apparatus such as the reflow furnace 206 consumes a large amount of electric power at an early stage (indicated by a in FIG. 8) immediately after being turned, on, and the control of electric power is started at a timing (indicated by b in FIG. 8) when the temperature inside of the furnace reaches the preset temperature. After that, after a given period of electric power control, the temperature inside of the furnace stabilizes at the preset temperature at a timing X, and the consumption of electric power, too, stabilizes. It should be noted the period from a point in time at which the reflow furnace 206 was turned on to the timing X is the amount of time (hereinafter referred to as "start-up time) required for the start-up, and the amount of start-up electric power takes on a value of integral of electric power waveforms during the period of start-up time. It should be noted that at the timing X and later, the mode of electric power consumption is Type 3 as mentioned above.

As shown in (a) and (b) of FIG. 8, in a state where there is residual heat in the reflow furnace 206, as compared with a state where there is no residual heat, the time it takes for the temperature inside of the furnace to reach the preset temperature is shorter and the amount of start-up electric power is smaller.

<Configuration of Simulation Apparatus>

A simulation apparatus according to one or more embodiments of the present invention is an apparatus for simulating, in view of the respective types of mode of electric power consumption of piece of equipment as those mentioned above, the consumption of electric power during a predetermined period of time (for example, one day) in a virtual model of a production line. This makes it possible to highly accurately simulate electric power consumption that is similar to the consumption of electric power by a real production line.

Figure 9:
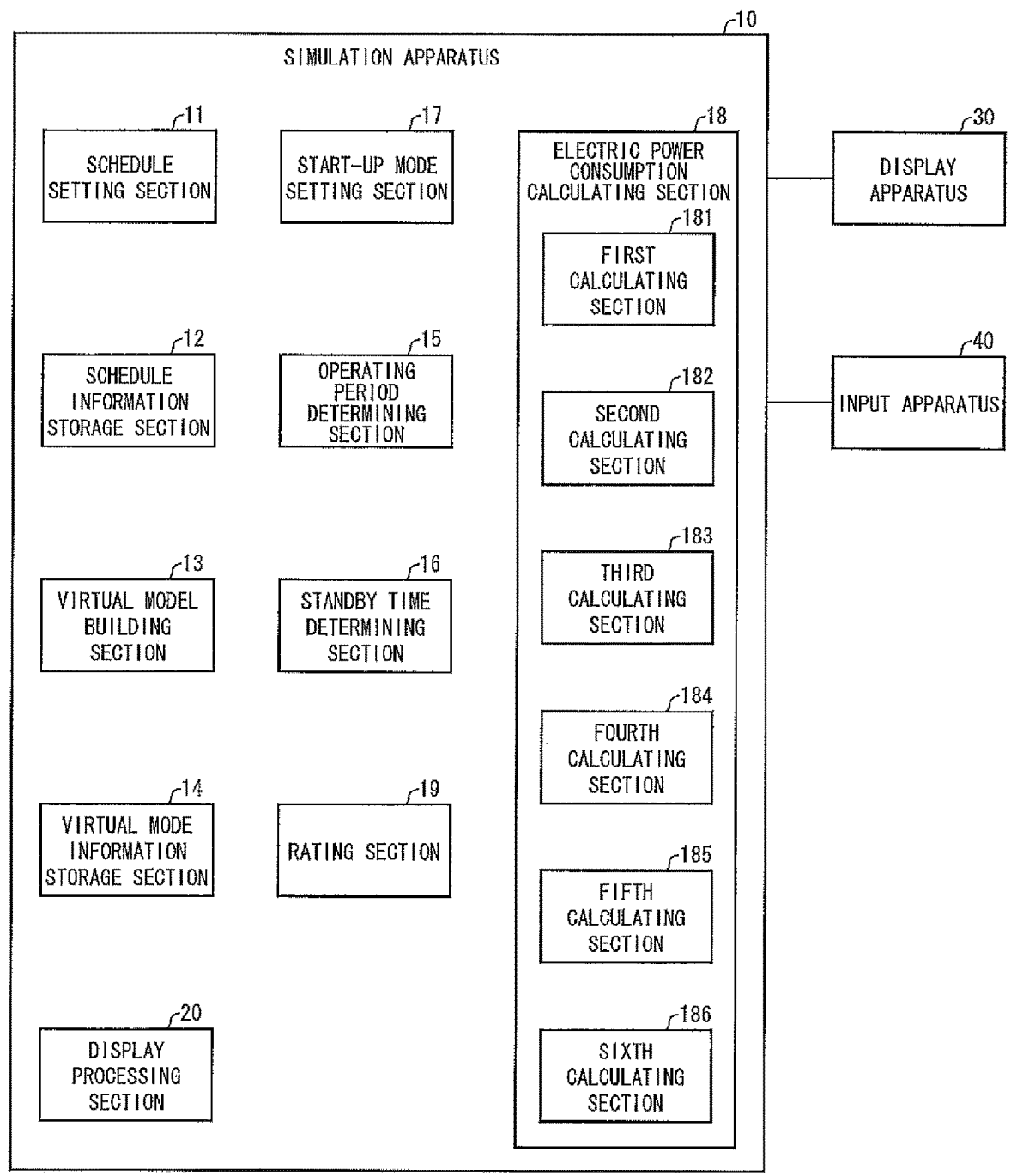
FIG. 9 is a block diagram showing a configuration of a simulation apparatus according to one or more embodiments of the present invention.

FIG. 9 is a block diagram showing a configuration of a simulation apparatus 10. As shown in FIG. 9, the simulation apparatus 10 is connected to a display apparatus 30 and to an input apparatus 40. Moreover, the simulation apparatus 10 includes a schedule setting section 11, a schedule information storage section 12, a virtual model building section 13, a virtual model information storage section 14, an operating period determining section 15, a standby time determining section 16, a start-up mode setting section 17, an electric power consumption calculating section 18, a rating section 19, and a display processing section 20.

It should be noted that the simulation apparatus 10 is constituted, for example, by a PC (personal computer) based computer. Moreover, a process in the simulation apparatus 10 is realized by causing the computer to execute a program. This program is stored, for example, on a removable medium such as a CD-ROM (compact disc read only memory) so that the simulation apparatus 10 may read and execute the program stored on the removable medium (computer-readable storage medium). Alternatively, the simulation apparatus 10 may read and execute a program installed on a hard disk (computer-readable storage medium).

The display apparatus 30 receives display data from the simulation apparatus 10 and display-outputs various types of information in the form of characters, images, etc. on the basis of such display data. The display apparatus is display means such as an LCD (liquid crystal display), a PDP (plasma display), and an organic EL (electroluminescence) display.

The input apparatus 40 receives various types of input from a user, and is constituted by input buttons, a keyboard, a pointing device such as a mouse, and other input devices. The input apparatus 40 receives information from an operator, converts the information into input data, and transmits the input data to the simulation apparatus 10.

(Schedule Setting Section)

The schedule setting section 11 sets a schedule for operation/suspension in a virtual model of a production line in accordance with input to the input apparatus 40. Specifically, the schedule setting section 11 generates, in accordance with a user's input, schedule information that indicates (i) a planned period of operation, of a predetermined period of time (for example, one day), during which the production line is in operation and (ii) a planned period of suspension, of the predetermined period of time, during which a production process is under suspension. Then, the schedule setting section 11 stores the schedule information in the schedule information storage section 12. The user needs only input a planned period of operation and a planned period of suspension in consideration of lunch breaks, shifts, etc. on an actual production line.

(Schedule Information Storage Section)

The schedule information storage section 12 is a section in which to store schedule information set by the schedule setting section 11. FIG. 10 shows an example of schedule information. In the example shown in FIG. 10, there are planned periods of operation A to D and planned periods of suspension E to H set within a period of one day with a beginning at 2:00, at which the schedule is set to begin.

(Virtual Model Building Section)

The virtual model building section 13 builds, in accordance with input to the input apparatus 40, a virtual mode of a production line that serves as an object of simulation. Specifically, the virtual model building section 13 performs the following process:

The virtual model building section 13 causes the display apparatus 30 to display a screen image that prompts the user to input information required for building a virtual model of a production line and obtains information inputted to the input apparatus 40. Examples of information that the virtual model building section 13 prompts the user to input are as follows:

(a) Equipment identification information (for example, equipment name) for identifying each piece of equipment included in the virtual model. It should be noted that in a case where there are plural pieces of equipment for performing exactly the same process, a single item of equipment identification information is inputted for those plural pieces of equipment. Alternatively, in the case of plural pieces of equipment that are of the same specifications but are disposed for performing different processes on a workpiece, different items of equipment identification information are inputted for different pieces of equipment.

(b) Number of pieces of equipment. It should be noted as for the number to be inputted here, the number is set for those pieces of equipment which perform exactly the same process.

(c) Mode type information that indicates the type of mode of electric power consumption of each piece of equipment.

(d) Equipment type information that indicates whether a piece of equipment is a piece of line equipment or supporting equipment.

(e) Order in which the pieces of line equipment take turns to perform processes on a workpiece.

FIG. 11 shows an example of the items of information (a) through (e). In FIG. 11, the pieces of equipment designated by the equipment type information "LINE" are pieces of line equipment, and the pieces of equipment designated by the equipment type information "SUPPORTING" are pieces of supporting equipment.

Furthermore, the virtual model building section 13 prompts the user to input the following items of information and obtain them from the input apparatus 40:

(f) For a piece of line equipment that exhibits a mode of electric power consumption of Type 1, 2, or 4, the amount of reference electric power, i.e. the amount of electric power per unit time that is required separately from the fixed amount of equipment electric power for operating the piece of line equipment. For example, the user needs only input, as an amount of reference electric power, an amount of electric power calculated by conducting an experiment or the like in advance to find an amount of electric power consumed by a targeted piece of equipment having operated continuously for a predetermined period of time (for example, one hour) and subtracting (Fixed Amount of Unit Electric Power×Predetermined Period of Time) from the amount of electric power consumed. More specifically, the user needs only input an amount of reference electric power calculated from such a waveform of electric power as that shown in FIG. 2 according to the amount of equipment electric power in continuous operation.

(g) For a piece of line equipment that exhibits a mode of electric power consumption of Type 1, 2, or 4, the amount of unit operation electric power required for the piece of line equipment to perform a predetermined unit operation on a workpiece. As mentioned above, the amount of unit operation electric power does not include a fixed amount of equipment electric power. The amount of unit operation electric power needs only be calculated from a waveform, such as those shown in FIGS. 2 through 4 and 6, obtained by conducting an experiment or the like. In the case of the waveform of electric power shown in FIG. 2 where the printing machine 201 performs a single round of cleaning operation every time it performs ten rounds of printing operation, the amount of unit operation electric power takes on a value obtained by dividing, by 10, a value obtained by subtracting the fixed amount of equipment electric power from the amount of electric power that is consumed by continuously performing ten rounds of printing operation and one round of cleaning operation. In this case, the unit operation is a set of printing and cleaning operations that are performed on a single substrate. Further, in the case of the high-speed packaging machine 203 or the high-precision packaging machine 204, the unit operation may be an operation for packaging a single component onto a substrate or an operation for packaging a predetermined number of components on a substrate.

(h) For a piece of line equipment that exhibits a mode of electric power consumption of Type 1, 2, or 4, the number of operations (number of processes) that the piece of line equipment performs a unit operation. For example, in the case of the printing machine 201 performing, as a unit operation, a set of printing and cleaning operations on a single substrate, the number of operations is equal to the number of substrates that are put into the printing machine 201. In the case of the high-speed packaging machine 203 performing, as a unit operation, an operation for packaging a single component onto a substrate, the number of operations is equal to a number obtained by multiplying, by the number of components that are packaged onto a single substrate by the high-speed packaging machine 203, the number of substrates that are put into the printing machine 201. It should be noted that the user inputs the number of operations that are supposed to be performed in a planned period of operation, of a predetermined period of time (for example, one day), which is indicated by schedule information set by the schedule setting section 11.

(i) First fixed amount of unit electric power for a piece of equipment that exhibits a mode of electric power consumption of Type 1.

(j) Second and third fixed amounts of unit electric power for a piece of equipment that exhibits a mode of electric power consumption of Type 2. Also, standby state information that indicates a type of standby state in which each of the second and third fixed amounts of unit electric power is consumed.

It should be noted the standby state information is categorized into information that indicates a state in which to wait for a workpiece to be conveyed from the preceding piece of equipment and information that indicates a state in which to wait for a workpiece to be conveyed to the next piece of equipment.

(k) Fourth fixed amount for unit electric power in a piece of equipment that exhibits a mode of electric power consumption of Type 3. The user may calculate the fourth fixed amount of unit electric power from such a waveform of electric power as that shown in FIG. 5 or may use the rated electric power of the piece of equipment as the fourth fixed amount of unit electric power.

(l) Number of workpieces that are put into a piece of line equipment that exhibits a mode of electric power consumption of Type 3 (hereinafter referred to as "number of workpieces to be inputted") (number of processes). It should be noted that as for a piece of line equipment shown to take a shorter period of time than the other pieces of line equipment to perform a process on a workpiece, it is possible to omit to enter the number of workpieces to be inputted. In omitting to enter the number of workpieces to be inputted, the user needs only enter a string of characters such as "IGNORED".

(m) Maximum number of workpieces that can be processed in a predetermined period of time (for example, one hour) by a piece of line equipment that exhibits a mode of electric power consumption of Type 3 (hereinafter referred to as "maximum number of workpieces to be processed") It should be noted that as for a piece of line equipment shown to take a shorter period of time than the other pieces of line equipment to perform a process on a workpiece, it is possible to omit to enter the maximum number of workpieces that can be processed. In omitting to enter the maximum number of workpieces that can be processed, the user needs only enter a string of characters such as "IGNORED".

FIG. 12 shows examples of the items of information (f) through (m) in its region A. In FIG. 12, the entry "PRECEDING" in the standby state information column indicates a state in which to wait for a workpiece to be conveyed from the preceding piece of equipment, and the entry "SUBSEQUENT" in the standby state information column indicates a state in which to wait for a workpiece to be conveyed to the next piece of equipment. Further, in FIG. 12, the "FIXED AMOUNT OF UNIT ELECTRIC POWER" column indicates a first fixed amount of unit electric power for a piece of equipment belonging to Type 1. As for a piece of equipment belonging to Type 2, the entry "SECOND" indicates a second fixed amount of unit electric power and the entry "THIRD" indicates a third fixed amount of unit electric power. The "FIXED AMOUNT OF UNIT ELECTRIC POWER" column also indicates a fourth fixed amount of unit electric power for a piece of equipment belonging to Type 3.

It should be noted that (f) amount of reference electric power, (g) amount of unit operation electric power, (i) first fixed amount of unit electric power, (j) second and third fixed amounts of unit electric power, (k) fourth amount of unit electric power, and (m) maximum number of workpieces to be processed are inputted as values for each separate piece of equipment.

Meanwhile, (h) number of operations and (l) number of workpieces to be inputted are each inputted as the total of values for all (b) pieces of equipment inputted. It should be noted that (h) number of operations and (l) number of workpieces to be inputted are inputted as values for a period of time (for example, one day) indicated by schedule information set by the schedule setting section 11.

Further, the user may input, as the fourth fixed amount of unit electric power of the air-conditioning machine 212, the rated electric power of the air-conditioning machine 212 to be installed or "AUTOMATIC". In a case where the fourth fixed amount of unit electric power of the air-conditioning machine 212 is set as "AUTOMATIC", an optimum rated electric power of the air-conditioner 212 is automatically set as the fourth fixed amount of unit electric power on the basis of the amount of electric power that is consumed by the pieces of equipment in the virtual model.

Furthermore, the virtual model building section 13 prompts the user to input the following items of information and obtain them from the input apparatus 40:

(n) For a piece of equipment that exhibits a mode of electric power consumption of Type 5, the required period of time (start-up time) from a point in time at which the piece of equipment was turned on to a point in time at which the piece of equipment stabilizes and the amount of electric power that is consumed over the period of start-up time (start-up electric power).

(o) For a piece of equipment that exhibits a mode of electric power consumption of Type 6, a start-up electric power table containing information regarding start-up electric power. The start-up electric power table is a table that shows a relationship of correspondence among (1) a period of suspension of a piece of equipment having temporarily been turned off when it was stable at the preset temperature, (2) a required period of start-up time from a point in time at which the piece of equipment was turned on to a point in time at which the piece of equipment again stabilizes at the end of the period of suspension, and (3) the amount of electric power (start-up electric power) that is consumed during the period of start-up time. It should be noted that this table may also contain a period of time (power-off time) from a point in time at which the piece of equipment was turned off to a point in time at which the piece of equipment is turned on. The period of power-off time is a period of time calculated by subtracting the period of start-up time from the period of suspension. The start-up electric power table is created in advance by conducting an experiment to measure waveforms of electric power over a period of time from a point in time at which a piece of equipment was temporarily turned off when it was stable at the preset temperature to a point in time at which the temperature inside of the furnace again stabilizes at the preset temperature after the piece of equipment is turned on, with variations in period of time from a point in time at which the piece of equipment was turned off to a point in time at which the piece of equipment is turned on. It should be noted that the term "period of suspension" here means a period of time during which a piece of equipment is unstable and therefore cannot operate in a normal manner. As such, the period of suspension includes a period of time during which the piece of equipment has been turned on but is being started up.

FIG. 12 shows examples of the items of information (n) and (o) in its region B. Further, FIG. 13 shows an example of the start-up electric power table T shown in FIG. 12. It should be noted that the items of information (n) and (o) are inputted as information for each separate piece of equipment.

In the start-up electric power table T shown in FIG. 13, the period of start-up time "30 MINUTES" corresponds to the periods of suspension "15 MINUTES" and "30 MINUTES". This means that a piece of equipment having been turned on right after being temporarily turned off when it was stable at the preset temperature takes 30 minutes for the temperature inside of the furnace to again stabilize at the preset temperature. That is, even the shortest period of start-up time is 30 minutes. For this reason, in a case where the period of suspension is 15 minutes, the temperature inside of the furnace cannot be stabilized at the preset temperature at the end of the period of suspension unless the piece of equipment is turned on 15 minutes before the beginning of the period of suspension. That is, this means that the piece of equipment cannot be turned off at some point in the period of suspension. The same applies to a case where the period of suspension is 30 minutes. In a case where (Period of Stoppage)−(Period of Start-up Time)=(Period of Power-off Time) is 0 or less, this means that the piece of equipment cannot be turned off during the period of suspension.

The virtual model building section 13 receives the items of information (a) through (o) inputted and, as shown in FIGS. 11 and 12, stores, in the virtual model information storage section 14, (a) equipment identification information and items of information (b) through (o) about the piece of equipment identified by the equipment identification information, with the item (a) of information associated with the items of information (b) through (o).

(Virtual Model Information Storage Section)

The virtual model information storage section 14 is a section in which to store the items of information (a) through (o) set by the virtual model building section 13, with the items of information (a) through (o) associated with one another.

(Operating Period Determining Section)

The operating period determining section 15 determines, for each piece of line equipment, a period of equipment operation, i.e. a requisite minimum period of time during which the piece of line equipment is operated. Specifically, on the basis of the number of pieces of equipment, the amount of reference electric power, the number of operations, and the amount of unit operation electric power, the operating period determining section 15 determines, for each of those pieces of line equipment belonging to Type 1, 2, or 4, the period of equipment operation according to the following expression:

(Period of Equipment Operation)=(Amount of Unit Operation Electric Power)×(Number of Operations)/{(Amount of Reference Electric Power)×(Number of Pieces of Equipment)}.

Further, on the basis of the number of workpieces to be inputted and the maximum number of workpieces to be processed, the operating period determining section 15 determines, for a piece of line equipment belonging to Type 3, the period of equipment operation according to the following expression:

(Period of Equipment Operation)=(Number of Workpieces To Be Inputted)/{(Maximum Number of Workpieces To Be Processed)×(Number of Pieces of Equipment).

Note, however, that a period of equipment operation is not determined for a piece of line equipment of Type 3 for which the number of workpieces to be inputted and the maximum number of workpieces to be processed are not set.

The operating period determining section 15 makes, for each piece of line equipment, a comparison between the period of equipment operation determined for that piece of equipment and the total of planned periods of operation as contained in the schedule information. In a case where the period of equipment operation determined is greater than the total of planned periods of operation, the operating period determining section 15 causes the display apparatus 30 to display an error notification that prompts the user to reset the schedule information or rebuild the virtual model, as it is impossible to operate the piece of equipment in the predetermined period of time (for example, one day) indicated by the schedule information.

On the other hand, in a case where the period of equipment operation determined is not greater than the total of planned periods of operation, the operating period determining section 15 outputs, to the standby time determining section 16 and the electric power consumption calculating section 18, operating period information that makes an association between equipment identification information (equipment name) that identifies a piece of line equipment and a period of equipment operation determined for that piece of equipment.

Further, the operating period determining section 15 extracts the longest period of equipment operation as a period of line operation (longest period of operation) from among those periods of equipment operation determined by the operating period determining section 15 and outputs the period of line operation thus extracted to the standby time determining section 16 and the electric power consumption calculating section 18.

(Standby Time Determining Section)

The standby time determining section 16 determines a period of standby time for each of those pieces of line equipment belonging to Type 1 or 2. The standby time determining section 16 determines a period of standby time for each of those pieces of line equipment belonging to Type 1 or 2 by subtracting, from a period of line operation, a period of equipment operation determined for that piece of equipment.

Further, the standby time determining section 16 specifies, as a longest-operated piece of equipment, a piece of line of equipment corresponding to the longest period of equipment operation. Then, the standby time determining section 16 makes, for each of those pieces of equipment belonging to Type 2, a comparison between a turn as set forth in (e) above for that piece of equipment and a turn corresponding to the longest-operated piece of equipment. The standby time determining section 16 determines that the standby state of a piece of equipment taking a turn following the turn of the longest-operated piece of equipment is a standby attributed to a delay of processing of the preceding piece of equipment and that the standby state of a piece of equipment taking a turn preceding the turn of the longest-operated piece of equipment is a standby attributed to a delay of processing of the next piece of equipment, and generates a result of the determination (hereinafter referred to as "standby state determination result").

For a piece of line equipment for which the standby time determining section 16 has determined a period of standby time, the standby time determining section 16 outputs, to the electric power consumption calculating section 18, standby time information that makes an association between equipment identification information that identifies that piece of equipment and a period of standby time determined for the piece of equipment. It should be noted that in a case where the standby time determining section 16 has generated a standby state determination result, the standby time determining section 16 incorporates the standby state determination result into the standby time information.

(Start-Up Mode Setting Section)

The start-up mode setting section 17 sets, for a piece of equipment that exhibits a mode of electric power consumption of Type 5 or 6, either a first mode in which the piece of equipment is kept on even during a planned period of suspension and a second mode in which electric power is saved by keeping the piece of equipment off for as long as possible during a planned period of suspension. The start-up mode setting section 17 selects either the first or second mode in accordance with the user's input to the input apparatus, and outputs, to the electric power consumption calculating section 18, start-up mode information that indicates the mode thus selected.

(Electric Power Consumption Calculating Section)

The electric power consumption calculating section 18 calculates an anticipated amount of electric power that is consumed by the virtual mode in a predetermined period of time (for example, one day) indicated by the schedule information. The electric power consumption calculating section 18 includes a first calculating section 181, a second calculating section 182, a third calculating section 183, a fourth calculating section 184, a fifth calculating section 185, and a sixth calculating section 186.

(First Calculating Section)

The first calculating section 181 calculates the amount of electric power that is consumed by a piece of line equipment that exhibits a mode of electric power consumption of Type 1 (first amount of electric power consumption). However, in a case where the piece of line equipment also belongs to Type 5 or Type 6, the first calculating section 181 calculates an amount of electric power consumption for a period of time excluding a planned period of suspension. For each piece of line equipment belonging to Type 1, the first calculating section 181 calculates the first amount of electric power consumption according to the following Expression (1) on the basis of the number of these pieces of equipment, the first fixed amount of unit electric power, the amount of unit operation electric power, and the number of operations, all of which are indicated by the virtual model information, and the period of line operation as outputted from the operating period determining section 15:

(First Amount of Electric Power Consumption)=
(Amount of Unit Operation Electric Power)×
(Number of Operations)+(Period of Line Operation)×(First Fixed Amount of Unit Electric Power)×(Number of Pieces of Equipment)     Expression (1).

Thus, for a piece of equipment set to Type 1, the first calculating section 181 outputs the first amount of electric power consumption on the basis of the number of processes (number of operations) and the period of line operation. It should be noted that according to the expression above, the first calculating section 181 calculates, for a case where there are plural pieces of equipment, the total of amounts of electric power that are consumed by the plural pieces of equipment.

The first term on the right side of Expression (1) indicates an amount of electric power that needs to be consumed only in an operating state, and the second term on the right side of Expression (1) indicates an amount of electric power that needs to be consumed both in a standby state and an operating state. That is, Expression (1) is based on the premise that in a standby state, the first fixed amount of unit electric power is consumed per unit time and that in an operating state, an amount of electric power calculated by multiplying the amount of unit operation electric power by the number of operations is further consumed. This makes it possible to, for a piece of line equipment belonging to Type 1, simulate electric power consumption in view of the difference in mode of electric power consumption between the standby state and the operating state.

(Second Calculating Section)

The second calculating section 182 calculates the amount of electric power that is consumed by a piece of line equipment that exhibits a mode of electric power consumption of Type 2 (second amount of electric power consumption). However, in a case where the piece of line equipment also belongs to Type 5 or Type 6, the second calculating section 182 calculates an amount of electric power consumption for a period of time excluding a planned period of suspension. For each piece of line equipment belonging to Type 2, the second calculating section 182 calculates the second amount of electric power consumption in the following manner on the basis of the number of these pieces of equipment, the second fixed amount of unit electric power, the third fixed amount of unit electric power, the amount of unit operation electric power, and the number of operations, all of which are indicated by the virtual model information, the period of line operation and the period of equipment operation as outputted from the operating period determining section 15, and the period of standby time and the standby state determination result as outputted from the standby time determining section 16.

<In the Case of a Standby State Determination Result Indicating a Standby Attributed to a Delay of Processing the Preceding Piece of Equipment>

The second calculating section 182 confirms, with reference to the content of the virtual model information, whether the fixed amount of unit electric power corresponding to the standby state information "PRECEDING" is the second fixed amount of unit electric power or the third fixed amount of unit electric power (which is smaller than the second fixed amount of unit electric power). In a case where the fixed amount of unit electric power corresponding to the standby state information "PRECEDING" is the second fixed amount of unit electric power (i.e. the smaller fixed amount of unit electric power), the second calculating section 182 calculates the second amount of electric power consumption according to Expression (2-1):

(Second Amount of Electric Power Consumption)=
(Amount of Unit Operation Electric Power)×
(Number of Operations)+(Period of Line Operation)×(Third Fixed Amount of Unit Electric Power)×(Number of Pieces of Equipment)−
(Standby Time)×{(Third Fixed Amount of Unit Electric Power)−(Second Fixed Amount of Unit Electric Power)}×(Number of Pieces of Equipment)     Expression (2-1).

Alternatively, the second calculating section 182 may also calculate the second amount of electric power consumption according to Expression (2-2):

(Second Amount of Electric Power Consumption)=
(Amount of Unit Operation Electric Power)×
(Number of Operations)+(Period of Equipment Operation)×(Third Fixed Amount of Unit Electric Power)×(Number of Pieces of Equipment)+
(Standby Time)×(Second Fixed Amount of Unit Electric Power)×(Number of Piece of Equipment)     Expression (2-2).

Alternatively, the second calculating section 182 may also calculate the second amount of electric power consumption according to Expression (2-3):

(Second Amount of Electric Power Consumption)=
(Amount of Unit Operation Electric Power)×
(Number of Operations)+(Period of Equipment Operation-Standby Time)×(Third Fixed Amount of Unit Electric Power)×(Number of Pieces of Equipment)+(Standby Time)×(Second Fixed Amount of Unit Electric Power)×(Number of Piece of Equipment)     Expression (2-3).

Alternatively, in a case where the fixed amount of unit electric power corresponding to the standby state information "PRECEDING" is the third fixed amount of unit electric power (i.e. the larger fixed amount of unit electric power), the second calculating section 182 calculates the second amount of electric power consumption according to Expression (2-4):

(Second Amount of Electric Power Consumption)=
(Amount of Unit Operation Electric Power)×
(Number of Operations)+(Period of Line Operation)×(Third Fixed Amount of Unit Electric Power)×(Number of Piece of Equipment)   Expression (2-4).

Alternatively, the second calculating section 182 may also calculate the second amount of electric power consumption according to Expression (2-5):

(Second Amount of Electric Power Consumption)=
(Amount of Unit Operation Electric Power)×
(Number of Operations)+(Period of Equipment Operation)×(Third Fixed Amount of Unit Electric Power)×(Number of Pieces of Equipment)+
(Standby Time)×(Third Fixed Amount of Unit Electric Power)×(Number of Pieces of Equipment)   Expression (2-5).

<In the Case of a Standby State Determination Result Indicating a Standby Attributed to a Delay of Processing the Next Piece of Equipment>

The second calculating section 182 confirms, with reference to the content of the virtual model information, whether the fixed amount of unit electric power corresponding to the standby state information "SUBSEQUENT" is the second fixed amount of unit electric power or the third fixed amount of unit electric power (which is smaller than the second fixed amount of unit electric power). In a case where the fixed amount of unit electric power corresponding to the standby state information "SUBSEQUENT" is the second fixed amount of unit electric power (i.e. the smaller fixed amount of unit electric power), the second calculating section 182 calculates the second amount of electric power consumption according to any of Expressions (2-1) to (2-3).

Alternatively, in a case where the fixed amount of unit electric power corresponding to the standby state information "SUBSEQUENT" is the third fixed amount of unit electric power (i.e. the larger fixed amount of unit electric power), the second calculating section 182 calculates the second amount of electric power consumption according to Expression (2-4) or (2-5).

In a case where the period of standby time is 0, the second calculating section 182 needs only calculate the second amount of electric power consumption by inputting a standby time of 0 into any one of the foregoing expressions.

Thus, for a piece of equipment set to Type 2, the second calculating section 182 calculates the second amount of electric power consumption on the basis of the number of processes (number of operations), the period of equipment operation (or the period of line operation), and the period of standby time and the standby state information. It should be noted that according to the expressions (2-1) to (2-5), the second calculating section 182 calculates, for a case where there are plural pieces of equipment, the total of amounts of electric power that are consumed by the plural pieces of equipment.

The first term on the right side of each of Expressions (2-1) through (2-5) indicates an amount of electric power that needs to be consumed only in an operating state, and each of the second and third terms on the right side of Expression (1) indicates an amount of electric power that needs to be consumed both in a standby state and an operating state. That is, Expressions (2-1) through (2-5) are based on the premise that in a standby state corresponding to the second fixed amount of unit electric power, the second fixed amount of unit electric power is consumed per unit time, that in a standby state corresponding to the third fixed amount of unit electric power, the third fixed amount of unit electric power is consumed per unit time, and that in an operating state, an amount of electric power calculated by multiplying the amount of unit operation electric power by the number of operations is further consumed. This makes it possible to, for a piece of line equipment belonging to Type 2, simulate electric power consumption in view of the difference in mode of electric power consumption between the standby state and the operating state.

(Third Calculating Section)

The third calculating section 183 calculates the amount of electric power that is consumed by a piece of equipment that exhibits a mode of electric power consumption of Type 3 (third amount of electric power consumption). However, in a case where the piece of line equipment also belongs to Type 5 or Type 6, the third calculating section 183 calculates an amount of electric power consumption for a period of time excluding a planned period of suspension. For each piece of equipment belonging to Type 3, the third calculating section 183 calculates the third amount of electric power consumption according to the following Expression (3) on the basis of the period of line operation as outputted from the operating period determining section 15 and the fourth fixed amount of unit electric power and the number of pieces of equipment, both of which are contained in the virtual model information:

(Third Amount of Electric Power Consumption)=
(Period of Line Operation)×(Fourth Fixed Amount of Unit Electric Power)×(Number of Piece of Equipment)   Expression (3).

It should be noted that according to Expression (3) above, the third calculating section 182 calculates, for a case where there are plural pieces of equipment, the total of amounts of electric power that are consumed by the plural pieces of equipment.

(Fourth Calculating Section)

The fourth calculating section 184 calculates the amount of electric power that is consumed by a piece of line equipment that exhibits a mode of electric power consumption of Type 4 (fourth amount of electric power consumption). However, in a case where the piece of line equipment also belongs to Type 5 or Type 6, the fourth calculating section 184 calculates an amount of electric power consumption for a period of time excluding a period of start-up time. For each piece of equipment belonging to Type 4, the fourth calculating section 184 calculates the fourth amount of electric power consumption according to the following Expression (4) on the basis of the amount of unit operation electric power and the number of operations as set by the virtual model building section 13:

(Fourth Amount of Electric Consumption)=(Amount of Unit Operation)×(Number of Operations)   Expression (4).

It should be noted that even in a case where there are plural pieces of equipment, the fourth calculating section 184 calculates the total of amounts of electric power that are consumed by the plural pieces of equipment, as the number of operations that are performed by the total number of pieces of equipment has been set.

(Fifth Calculating Section)

The fifth calculating section 185 calculates the amount of electric power that is consumed during a planned period of suspension of a piece of equipment that exhibits a mode of electric power consumption of Type 5 (fifth amount of electric power consumption).

The fifth calculating section 185 calculates an estimated time of completion of operation on the basis of the period of line operation and the schedule information. Specifically, the fifth calculating section 185 determines an estimated time of completion of operation so that a sum of planned periods of operation from an estimated time of commencement of a planned period indicated by the schedule information coincides with a period of line operation. For example, in a case where such schedule information as that shown in FIG. 10 has been configured and the period of line operation is 6 hours, the fifth calculating section 185 calculates the estimated time of completion of operation to be 14:30. Then, the fifth calculating section 185 specifies all of the planned periods of suspension included in the period of time from the estimated time of commencement to the estimated time of completion. It should be noted here that each of the planned periods of suspension thus specified is referred to as "specific period of suspension". For each piece of equipment belonging to Type 5, the fifth calculating section 185 calculates the fifth amount of electric power consumption on the basis of the following: the specific periods of suspension; the period of start-up time, the amount of start-up electric power, the number of pieces of equipment, and the fixed amount of unit electric power, all of which are contained in the virtual model information; and the start-up mode information outputted from the start-up mode setting section 17.

In a case where the start-up mode information indicates the first mode, the fifth calculating section 185 calculates, for each piece of equipment belonging to Type 5, the fifth amount of electric power consumption according to the following Expression (5-1):

(Fifth Amount of Electric Power Consumption)=
(Amount of Start-up Electric Power)×(Number of Pieces of Equipment)+(Total of Specific Periods of Suspension Excluding Planned Period of Suspension Preceding First Planned Period of Operation)×(Fixed Amount of Unit Electric Power)×(Number of Pieces of Equipment)   Expression (5-1).

The fifth amount of electric power consumption according to Expression (5-1) is calculated on the premise of the following conditions: The piece of equipment is started up in a period of suspension preceding the first planned period of operation and is kept on during the remaining specific periods of suspension.

On the other hand, in a case where the start-up mode information indicates the second mode, the fifth calculating section 185 categorizes the specific periods of suspension for each piece of equipment belonging to Type 5 into a restartable period of suspension which is longer than the period of start-up time and during which the piece of equipment can be restarted and an unrestartable period of suspension which is equal to or shorter than the period of start-up time and during which the piece of equipment cannot be restarted. Then, the fifth calculating section 185 calculates the fifth amount of electric power consumption according to the following Expression (5-2):

(Fifth Amount of Electric Power Consumption)=
(Number of Restartable Periods of Suspension)×(Amount of Start-up Electric Power)×(Number of Pieces of Equipment)+(Total of Unrestartable Periods of Suspension)×(Fixed Amount of Unit Electric Power)×(Number of Pieces of Equipment   Expression (5-2).

The fifth amount of electric power consumption according to Expression (5-2) is calculated on the premise of the following conditions: For a restartable period of suspension, the piece of equipment is kept off for as long as possible during the period of time, and the piece of equipment is turned on at some point in the period of time so that the start-up of the piece of equipment is completed at the end of the period of time; for an unrestartable period of suspension, the piece of equipment is kept on. This makes it possible to calculate the amount of electric power consumption with a minimum of loss in electric power consumption in a planned period of suspension.

It should be noted that the term "fixed amount of unit electric power" refers to the first fixed amount of unit electric power in the case of a piece of equipment also belonging to Type 1, the second fixed amount of unit electric power in the case of a piece of equipment also belonging to Type 2, and the fourth fixed amount of unit electric power in the case of a piece of equipment also belonging to Type 3.

(Sixth Calculating Section)

The sixth calculating section 186 calculates the amount of electric power that is consumed during a planned period of suspension of a piece of equipment that exhibits a mode of electric power consumption of Type 6 (sixth amount of electric power consumption).

As with the fifth calculating section 185, the sixth calculating section 186 calculates an estimated time of completion so that a sum of periods of operation from an estimated time of commencement coincides with a period of line operation, and specifies specific periods of suspension. Then, for each piece of equipment belonging to Type 6, the sixth calculating section 186 calculates the sixth amount of electric power consumption on the basis of the following: the specific periods of suspension; the start-up electric power table, the number of pieces of equipment, and the fixed amount of unit electric power, all of which are contained in the virtual model information; and the start-up mode information outputted from the start-up mode setting section 17.

In a case where the start-up mode information indicates the first mode, the sixth calculating section 186 reads out, from the start-up electric power table for each piece of equipment belonging to Type 6, an amount of start-up electric power corresponding to a planned period of suspension preceding the first planned period of operation, and calculates the sixth amount of electric power consumption according to the following Expression (6-1):

(Sixth Amount of Electric Power Consumption)=
(Amount of Start-up Electric Power Corresponding to Planned Period of Suspension Preceding First Planned Period of Operation)×(Number of Piece of Equipment)+(Total of Specific Periods of Suspension Excluding Planned Period of Suspension Preceding First Planned Period of Operation)×(Fixed Amount of Unit Electric Power)×(Number of Pieces of Equipment)   Expression (6-1).

The sixth amount of electric power consumption according to Expression (6-1) is calculated on the premise of the following conditions: The piece of equipment is started up in a period of suspension preceding the first planned period of operation and is kept on during the remaining specific periods of suspension.

On the other hand, in a case where the start-up mode information indicates the second mode, the sixth calculating section 186 calculates the sixth amount of electric power consumption for each piece of equipment belonging to Type 6 in the following manner. That is, the sixth calculating section 186 reads out, for each specific period of suspension, (i) information as to whether or not the piece of equipment can be turned off and (ii) an amount of start-up electric power that correspond to a period of suspension identical to the specific period of suspension. In a case where the information as to whether or not the piece of equipment can be turned off indicates "YES", the sixth calculating section 186 categorizes the specific period of suspension as a restartable period of suspension. Alternatively, in a case where the information as to whether or not the piece of equipment can be turned off indicates "NO", the sixth calculating section 186 categorizes the specific period of suspension as an unrestartable period of suspension. Further, the sixth calculating section 186 reads out, from the start-up electric power table, an amount of start-up electric power corresponding to a period of suspension in the restartable period of suspension.

Then, the sixth calculating section 186 calculates the sixth amount of electric power consumption according to the following Expression (6-2):

(Sixth Amount of Electric Power Consumption)=
(Total of Amounts of Start-up Electric Power Corresponding to Restartable Periods of Suspension)×(Number of Pieces of Equipment)+
(Total of Unrestartable Periods of Suspension)×
(Fixed Amount of Unit Electric Power)×
(Number of Pieces of Equipment)    Expression (6-2).

The sixth amount of electric power consumption according to Expression (6-2) is calculated on the premise of the following conditions: For a restartable period of suspension, the piece of equipment is kept off for as long as possible during the period of time, and the piece of equipment is turned on at some point in the period of time so that the start-up of the piece of equipment is completed at the end of the period of time; for an unrestartable period of suspension, the piece of equipment is kept on. This makes it possible to calculate the amount of electric power consumption with a minimum of loss in electric power consumption in a planned period of suspension.

It should be noted that the term "fixed amount of unit electric power" refers to the first fixed amount of unit electric power in the case of a piece of equipment also belonging to Type 1, the second fixed amount of unit electric power in the case of a piece of equipment also belonging to Type 2, and the fourth fixed amount of unit electric power in the case of a piece of equipment also belonging to Type 3.

(Rating Section)

The rating section 19 sets a value of the fourth fixed amount of unit electric power of the air-conditioning machine 212 in a case where the virtual model building section 13 has set "AUTOMATIC" as the fourth fixed amount of unit electric power of the air-conditioning machine 121.

The rating section 19 has stored in advance therein a rated electric power table that makes an association between a range of electric power consumption of pieces of line equipment constituting a production line and the rated electric power of the air-conditioning machine 212 suitable to the production line. The rated electric power table is created in advance on the basis of experiments, experiences, etc. FIG. 14 shows an example of such a rated electric power table.

Then, the rating section 19 calculates, as an amount of line electric power, the total of amounts of electric power consumption calculated by the electric power consumption calculating section 18 for each of the pieces of line equipment, and sets, as the fourth fixed amount of unit electric power of the air-conditioning machine 212, rated electric power corresponding to the range of electric power consumption including the amount of line electric power. The rating section 19 outputs the fourth fixed amount of unit electric power thus set to the electric power consumption calculating section 18.

(Display Processing Section)

The display processing section 20 performs a process of causing the display apparatus 30 to display the amount of electric power consumption of each piece of equipment as calculated by the electric power consumption calculating section 18. The display processing section 20 calculates an amount of electric power consumption for each piece of equipment and causes the display apparatus 30 to display the amount of electric power consumption. Further, the display processing section 20 may calculate the total of amounts of electric power that are consumed by the pieces of line equipment, the total of amounts of electric power that are consumed by the pieces of supporting equipment, and the total of amounts of electric power that are consumed by all pieces of equipment and cause the display apparatus 30 to display the totals.

<Flow of Processes in Simulation Apparatus>

Figure 15:
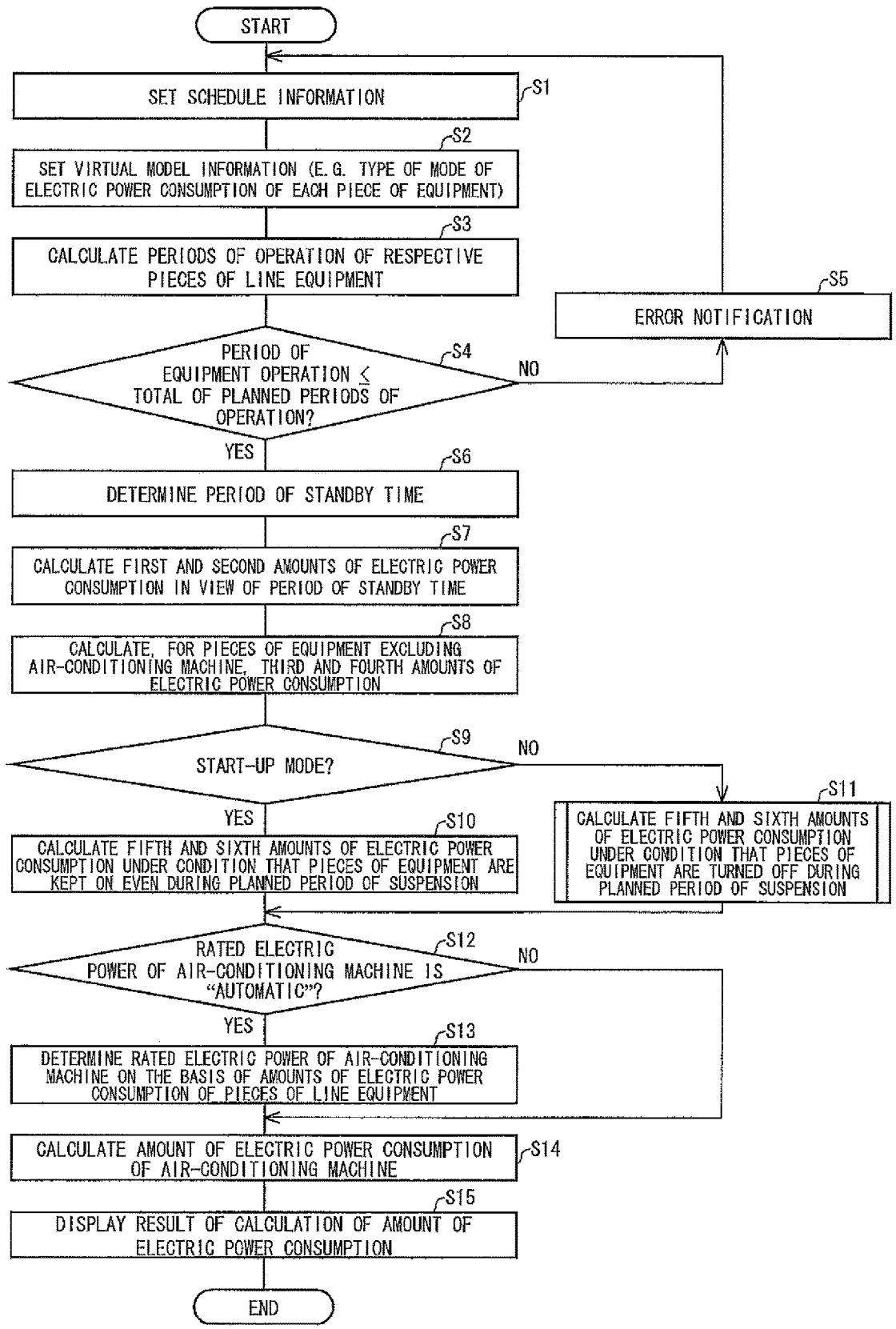
FIG. 15 is a flow chart showing a flow of processes of the simulation apparatus according to one or more embodiments of the present invention.

Next, the following describes a flow of processes in the simulation apparatus 10. FIG. 15 is a flow chart showing the flow of the processes in the simulation apparatus 10.

First, the schedule setting section 11 sets schedule information indicative of a planned period of operation and a planned period of suspension in a predetermined period of time (for example, one day) in accordance with input to the input apparatus 40 (S1). For example, the schedule setting section 11 sets the schedule information as shown in FIG. 10.

Next, the virtual model building section 13 sets the items of virtual model information (a) through (o) for each piece of equipment included in a virtual model of a production line in accordance with input to the input apparatus 40 (S2). In particular, in one or more embodiments of the present invention, the virtual model building section 13 sets a type (the Types 1 through 6) of mode of electric power consumption of each piece of equipment, and sets information in accordance with the type. A user may input a specific value or "AUTOMATIC" as the fourth fixed amount of unit electric power, which is an amount of rated electric power of the air-conditioning machine 212.

Next, the operating period determining section 15 calculates, for each piece of line equipment, a period of equipment operation, i.e. a requisite minimum period of time during which the piece of line equipment is operated (S3). A method for calculating the period of equipment operation is as described above.

The operating period determining section 15 makes, for each piece of line equipment, a comparison between the period of equipment operation determined for that piece of equipment and the total of planned periods of operation as contained in the schedule information (S4). For example, in the case of the schedule information shown in FIG. 10, the period of equipment operation is compared with 15.5 hours, which is the total of the planned periods of operation.

In a case where the period of equipment operation determined is greater than the total of planned periods of operation (No in S4), it means that it is impossible to operate the piece of equipment in the total of planned periods of operation because of inappropriate input of the schedule information, the number of operations, the number of pieces of equipment, or the like in the virtual model. Therefore, the operating period determining section 15 causes the display apparatus 30 to display an error notification that prompts the user to reset the schedule information or rebuild the virtual model (S5).

In a case where the period of equipment operation is not greater than the total of planned periods of operation (Yes in S4), the operating period determining section 15 extracts the longest period of equipment operation as a period of line operation from among those periods of equipment operation determined by the operating period determining section 15. Then, the standby time determining section 16 determines a period of standby time for each piece of line equipment belonging to Type 1 or 2 by subtracting, from the period of line operation, a period of equipment operation determined for that piece of equipment (S6). Moreover, the standby time determining section 16 generates, for each piece of line equipment belonging to Type 2, a standby state determination result indicative of whether the standby state of the piece of equipment is attributed to a delay of processing of a preceding piece of equipment or to a delay of processing of a next piece of equipment.

Next, the first calculating section 181 calculates, for the piece of line equipment belonging to Type 1, the first amount of electric power consumption according to the above-mentioned Expression (1) on the basis of the number of these pieces of equipment, the first fixed amount of unit electric power, the amount of unit operation electric power, the number of operations, and the period of line operation. Expression (1) is based on the premise that in a standby state, the first fixed amount of unit electric power is consumed per unit time and that in an operating state, an amount of electric power calculated by multiplying the amount of unit operation electric power by the number of operations is further consumed. This makes it possible to, for a piece of line equipment belonging to Type 1, simulate electric power consumption in view of the difference in mode of electric power consumption between the standby state and the operating state.

The second calculating section 182 calculates, for the piece of equipment belonging to Type 2, the second amount of electric power consumption on the basis of the number of these pieces of equipment, the second fixed amount of unit electric power, the third fixed amount of unit electric power, the amount of unit operation electric power, the number of operations, the period of line operation, the period of equipment operation, the period of standby time, and the standby state determination result. Specific Expressions (2-1) through (2-5) are as described above. Expressions (2-1) through (2-5) above are based on a premise that in a standby state corresponding to the second fixed amount of unit electric power, the second fixed amount of unit electric power is consumed per unit time, that in a standby state corresponding to the third fixed amount of unit electric power, the third fixed amount of unit electric power is consumed per unit time, and that in an operating state, an amount of electric power calculated by multiplying the amount of unit operation electric power by the number of operations is further consumed. This makes it possible to, for a piece of line equipment belonging to Type 2, simulate electric power consumption in view of the difference in mode of electric power consumption between the standby state and the operating state.

The first calculating section 181 and the second calculating section 182 thus calculate the first amount of electric power consumption and the second amount of electric power consumption, respectively, while taking into a standby time into consideration (S7).

Next, the third calculating section 183 calculates, for a piece of equipment belonging to Type 3 excluding the air-conditioning machine 212, the third amount of electric power consumption on the basis of the period of line operation. Moreover, the fourth calculating section 184 calculates, for a piece of equipment belonging to Type 4, the fourth amount of electric power consumption (S8). These calculations can be performed according to the Expressions (3) and (4), respectively.

Next, the electric power consumption calculating section 18 checks start-up mode information outputted from the start-up mode setting section 17 (S9). In a case where the start-up mode information indicates the first mode, the fifth calculating section 185 and the sixth calculating section 186 calculate the fifth amount of electric power consumption and the sixth amount of electric power consumption in accordance with the Expression (5-1) and the Expression (6-1), respectively (S10). That is, an amount of electric power consumption during a planned period of suspension is calculated by causing the piece of equipment to be started up in a period of suspension preceding the first planned period of operation and be kept on during the remaining specific periods of suspension.

Meanwhile, in a case where the start-up mode information indicates the second mode, the fifth calculating section 185 and the sixth calculating section 186 calculate the fifth amount of electric power consumption and the sixth amount of electric power consumption in accordance with the Expression (5-2) and the Expression (6-2), respectively (S11). That is, it is possible to calculate an amount of electric power consumption during a planned period of suspension during which the piece of equipment is kept off for as long as possible. This allows a user to confirm an amount of electric power consumption calculated in a case where the start-up mode information indicates the first mode and an amount of electric power consumption calculated in a case where the start-up mode information indicates the second mode and to thereby evaluate an electric power saving effect attributable to the second mode.

Next, the rating section 19 determines whether or not "AUTOMATIC" is set as the fourth fixed amount of unit electric power corresponding to the air-conditioning machine 212 in the virtual model information (S12).

In a case where a specific value is set as the fourth fixed amount of unit electric power instead of "AUTOMATIC", the third calculating section 183 calculates, on the basis of the value, the third amount of electric power consumption consumed by the air-conditioning machine 212 (S14).

Meanwhile, in a case where "AUTOMATIC" is set, the rating section 19 calculates, as an amount of line electric power consumption, the total of the amounts of electric power consumption of the respective pieces of line equipment calculated in S7, S8, and S10, as shown in FIG. 16. Then, the rating section 19 reads out, from the rated electric power table (see FIG. 14), rated electric power corresponding to a range of electric power consumption including the line electric power consumption, and sets the rated electric power thus read out as the fourth fixed amount of unit electric power of the air-conditioning machine 212 (S13).

Subsequently, the third calculating section 183 calculates the third amount of electric power consumption consumed by the air-conditioning machine 212 on the basis of the fourth fixed amount of unit electric power outputted from the rating section 19 (S14).

Finally, the display processing section calculates an amount of electric power consumption for each piece of equipment on the basis of the first through sixth amounts of electric power consumption thus calculated. That is, the display processing section 20 calculates, for a piece of equipment belonging to any one of Types 1 through 4 and to Type 5 or 6, the total of (i) any one of the first through fourth amounts of electric power consumption which is calculated for that piece of equipment and (ii) the fifth amount of electric power consumption or the sixth amount of electric power consumption calculated for that piece of equipment. For a piece of equipment other than such a piece of equipment, the display processing section 20 sets, as an amount of electric power consumption of that piece of equipment, any one of the first through fourth amounts of electric power consumption which is calculated for that piece of equipment.

Then, the display processing section 20 causes the display apparatus 30 to display the amounts of electric power consumption for the respective pieces of equipment (S15). Moreover, the display processing section 20 may cause the display apparatus 30 to additionally display a total amount of electric power consumption of the pieces of line equipment, a total amount of electric power consumption of the pieces of supporting equipment, and a total amount of electric power consumption of all the pieces of equipment. This allows a user to easily grasp an amount of electric power consumption estimated in the virtual model.

<Specific Example of Calculation of First and Second Amounts of Electric Power Consumption>

FIG. 17 is a view showing specific examples of the processes in S3 to S7 carried out in a case where the virtual model information shown in FIG. 11 and FIG. 12 is set. In FIG. 17, processes identical to those in FIG. 15 are given identical reference numerals.

In FIG. 12, an amount of unit operation electric power and the number of operations are set for the printing machine 201 assuming that a series of printing operations on a single substrate is a unit operation. Specifically, the number of substrates is set as the number of operations. Moreover, an amount of unit operation electric power and the number of operations are set for the high-speed packaging machine 203 and the high-precision packaging machine 204 assuming that an operation for packaging a single component onto a substrate is a unit operation. Specifically, the total number of components packaged by the packaging machines 203 and 204 is set as the number of operations.

Moreover, it is assumed that the various kinds of information has been input so that the number of pieces of equipment is 1 for each piece of line equipment and a period of operation of the high-speed packaging machine 203 is longest, as shown in FIG. 11.

As shown in FIG. 17, in S3, the amount of unit operation electric power is multiplied by the number of substrates to obtain an amount of equipment operation electric power for the printing machine 201, and the amount of unit operation electric power is multiplied by the number of components to obtain an amount of equipment operation electric power for the high-speed packaging machine 203 and to obtain an amount of equipment operation electric power for the high-precision packaging machine 204. The amounts of equipment operation electric power thus obtained are divided by respective amounts of reference electric power to obtain periods of operation of the respective pieces of equipment.

Subsequently, each of the periods of operation of the respective pieces of equipment is compared with the total of planned periods of operation (described simply as "planned periods of operation" in FIG. 17). In a case where it is confirmed that each of the periods of operation is not greater than the total of planned periods of operation, the periods of operation are compared with each other. As a result, a period of line operation and a period of standby time are determined. In FIG. 17, it is assumed that the period of operation of the high-speed packaging machine 203 is longest. In this case, the standby time determining section 16 outputs standby state information indicating "PRECEDING" for the high-precision packaging machine 204.

Then, for the printing machine 201, the first amount of electric power consumption is calculated on the basis of the period of line operation including the standby time. Moreover, for the high-precision packaging machine 204, the second amount of electric power consumption is calculated assuming that it is determined that a standby state occurs because of a delay of processing of the preceding piece of equipment, namely, the high-speed packaging machine 203, that in the standby state, an amount of electric power indicated by (Standby Time×Second Fixed Amount of Unit Electric Power) is consumed, and that in the operating state, an amount of electric power indicated by ((Period of Line Operation−Standby Time)×Third Fixed Amount of Unit Electric Power+Unit Operation Electric Power×Number of Components) is consumed.

Note that for the high-speed packaging machine 203, which is a piece of equipment that operates for the longest period, the second amount of electric power consumption is calculated assuming that an amount of electric power indicated by (Third Fixed Amount of Unit Electric Power× Period of Line Operation+Unit Operation Electric Power× Number of Components) is consumed.

<Specific Example of Calculation of Third and Fourth Amounts of Electric Power Consumption>

FIG. 18 is a view showing a specific example of the process in S8 carried out in a case where the virtual model information shown in FIG. 11 and FIG. 12 is set. According to the virtual model information shown in FIG. 11 and FIG. 12, there is no entry of a piece of equipment belonging to Type 4. Accordingly, only for a piece of equipment belonging to Type 3, the third amount of electric power consumption is calculated.

As shown in FIG. 18, the period of line operation, which is the longest period among periods of operation of the respective pieces of equipment calculated in S3, is multiplied with the fourth fixed amount of unit electric power (described as "RATED ELECTRIC POWER" in FIG. 18) to calculate the third amount of electric power consumption for the piece of equipment belonging to Type 3.

<Specific Example of Calculation of Fifth and Sixth Amounts of Electric Power Consumption in S11>

Figure 19:
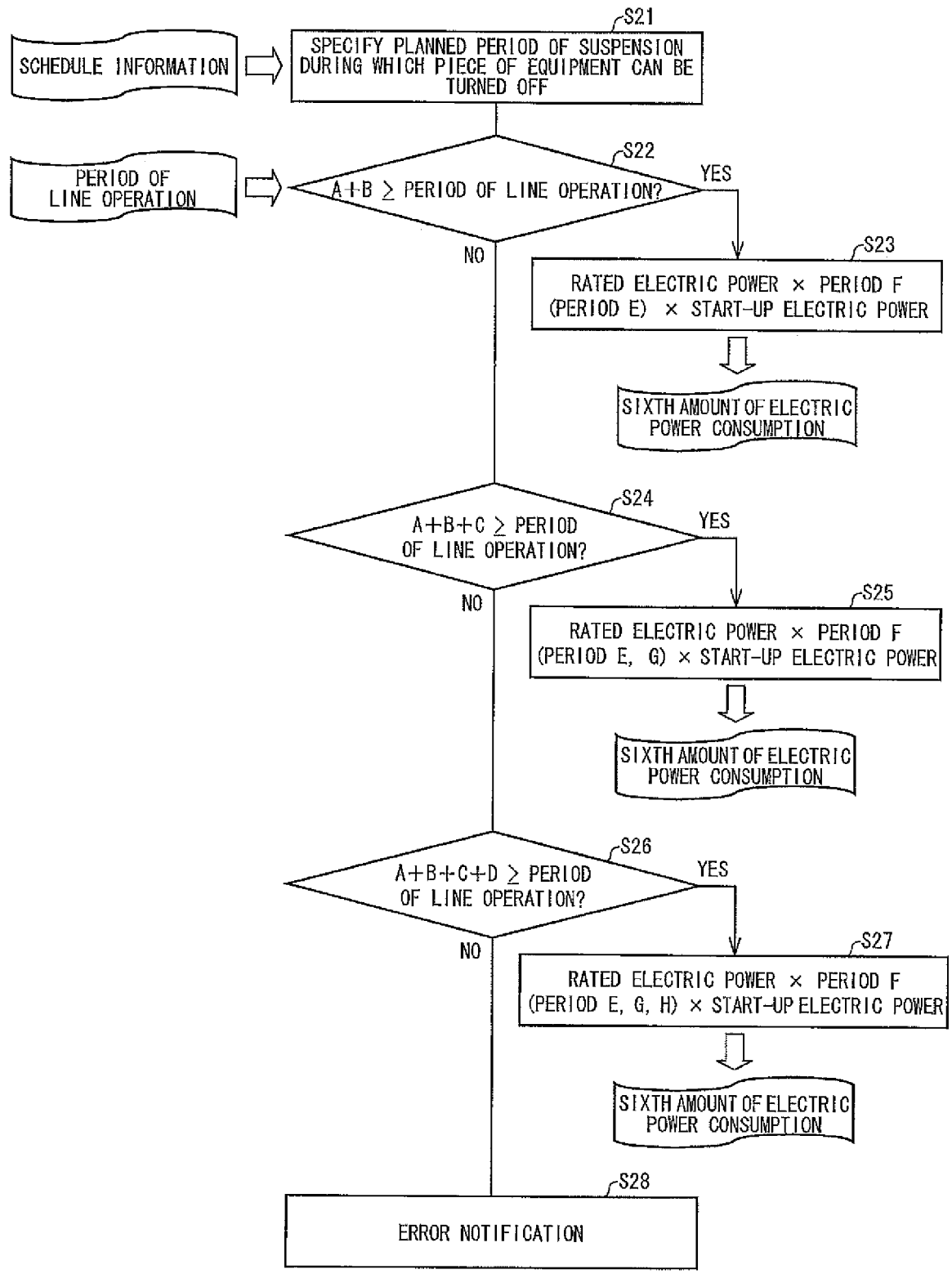
FIG. 19 is a view showing a specific example of the process in S11 in a case where the schedule information shown in FIG. 10 is set and the start-up electric power table shown in FIG. 13 is set.

FIG. 19 is a view showing a specific example of the process in S11 for calculating the sixth amount of electric power consumption which is carried out in a case where the schedule information shown in FIG. 10 is set and the start-up electric power table shown in FIG. 13 is set.

First, for each of the planned periods of suspension E through H set in the schedule information, the sixth calculating section 186 reads out, from the start-up electric power table, a period of start-up time corresponding to the planned period of suspension. Then, the sixth calculating section 186 determines that it is possible to turn a piece of equipment off during the planned period of suspension only in a case where the period indicated by the planned period of suspension is larger than the start-up time (S21). In the case of the schedule information shown in FIG. 10, the planned periods of suspension E, G and H, excluding the planned period of suspension F, are periods during which the piece of equipment can be turned off.

Next, the sixth calculating section 186 recognizes that the planned period of suspension E is the first one during which the piece of equipment can be turned off in the schedule information. Then, the sixth calculating section 186 calculates the total of planned periods of operation preceding the planned period of suspension E. In the schedule information shown in FIG. 10, the total is 0 because there is no planned period of operation preceding the planned period of suspension E. Therefore, the sixth calculating section 186 determines that the planned period of suspension G is the next one during which the piece of equipment can be turned off. Then, the sixth calculating section 186 calculates "4.5 hours", which is the total of the planned periods of operation A and B, which precede the planned period of suspension G, and compares the total with the period of line operation (S22).

In a case where the total of the planned periods of operation A and B is equal to or larger than the period of line operation (Yes in S22), the sixth calculating section 186 determines that only operation up to the planned period of operation B is needed, and calculates electric power consumption in the planned periods of suspension E and F, which precede the planned period of operation B. Specifically, as for the planned period of suspension E during which the piece of equipment can be turned off, the sixth calculating section 186 reads out, as electric power consumption in the period E from the start-up electric power table shown in FIG. 13, an amount of start-up electric power corresponding to the period E. As for the planned period of suspension F during which the piece of equipment cannot be turned off, the sixth calculating section 186 calculates an amount of electric power consumption in the period F by multiplying "0.5 hours" of the period F by the fourth fixed amount of unit electric power (described as "RATED ELECTRIC POWER" in FIG. 19). Then, the sixth calculating section 186 sums up the amounts of electric power consumption of the planned periods of suspension E and F thus obtained to calculate the sixth amount of electric power consumption (S23).

In a case where the total of the planned periods of operation A and B is less than the period of line operation (No in S22), the sixth calculating section 186 determines that the planned period of suspension H is the next one during which the piece of equipment can be turned off. Then, the sixth calculating section 186 calculates "9.5 hours", which is the total of the planned periods of operation A, B and C, which precede the planned period of suspension H, and compares the total with the period of line operation (S24).

In a case where the total of the planned periods of operation A, B and C is equal to or larger than the period of line operation (Yes in S24), the sixth calculating section 186 determines that only operation up to the planned period of operation C is needed, and calculates amounts of electric power consumption in the planned periods of suspension E, F and G, which precede the planned period of operation C. Specifically, as for the planned periods of suspension E and G during which the piece of equipment can be turned off, the sixth calculating section 186 reads out, as amounts of electric power consumption in the periods E and G from the start-up electric power table shown in FIG. 13, amounts of start-up electric power corresponding to the periods E and G. As for the planned period of suspension F during which the piece of equipment cannot be turned off, the sixth calculating section 186 calculates an amount of electric power consumption in the period F by multiplying "0.5 hours" of the period F by the fourth fixed amount of unit electric power (described as "RATED ELECTRIC POWER" in FIG. 19). Then, the sixth calculating section 186 sums up the amounts of electric power consumption of the planned periods of suspension E, F, and G thus obtained to calculate the sixth amount of electric power consumption (S25).

In a case where the total of the planned periods of operation A, B and C is less than the period of line operation (No in S24), the sixth calculating section 186 determines that there is no next planned period of suspension in which the piece of equipment can be turned off. Then, the sixth calculating section 186 calculates "15.5 hours", which is the total of all of the planned period of operations A, B, C and D, and compares the total with the period of line operation (S26).

In a case where the total of the planned periods of operation A, B, C and D is equal to or larger than the period of line operation (Yes in S26), the sixth calculating section 186 calculates amounts of electric power consumption in all of the planned periods of suspension E, F, G and H. Specifically, as for the planned periods of suspension E, G and H during which the piece of equipment can be turned off, the sixth calculating section 186 reads out, as amounts of electric power consumption in the periods E, G and H from the start-up electric power table shown in FIG. 13, amounts of start-up electric power corresponding to the periods E, G and H. As for the planned period of suspension F during which the piece of equipment cannot be turned off, the sixth calculating section 186 calculates an amount of electric power consumption in the period F by multiplying "0.5 hours" of the period F by the fourth fixed amount of unit electric power. The sixth calculating section 186 calculates the sixth amount of electric power consumption by summing up the obtained amounts of electric power consumption in the planned periods of suspension E, F, G and H.

In a case where the total of the planned periods of operation A, B, C and D is less than the period of line operation (No in S26), the line operation within the planned periods of operation is impossible, and therefore an error notification that prompts a user to change the schedule information is issued (S28). In one or more embodiments of the present invention, there is no case of No in S26 since an error notification has been issued in S5 of FIG. 15. Note, however, that in a modification in which the processes in S6 and subsequent steps can be carried out even in a case of No in S4 of FIG. 15, the process in S28 is carried out.

In a case where the fifth amount of electric power consumption is calculated in S11, the fifth calculating section 185 need only specify in S21, as a period during which the piece of equipment can be turned off, a planned period of suspension longer than a period of start-up time set for the piece of equipment. An amount of electric power consumption during the planned periods of suspension E, G, and H is determined to be an amount of start-up electric power set for the piece of equipment. The fifth calculating section 185 adds amounts of electric power consumption during the periods E and F in S23, adds amounts of electric power consumption during the periods E, F and G in S25, and adds amounts of electric power consumption during the periods E, F, G and H in S27.

As described above, the simulation apparatus 10 of one or more embodiments of the present invention, which simulates an amount of electric power consumed in a system including a plurality of pieces of equipment and outputs the amount of electric power thus simulated, includes the virtual model building section (type setting section) 13 setting a type of mode of electric power consumption of each of the pieces of equipment and the electric power consumption calculating section (output section) 18 outputting an amount of electric power consumption of each of the pieces of equipment in accordance with the type thus set.

This makes it possible to simulate, for each piece of equipment, an amount of electric power consumption in accordance with a mode of electric power consumption of that piece of equipment and output the amount of electric power consumption thus simulated, thereby making it possible to highly accurately simulate the amount of electric power consumption. That is, it is possible to output an accurate amount of electric power consumption necessary for production in view of an actual operating state.

Moreover, it is possible to judge occurrence of a trouble by comparing an accurate value of electric power consumption that has been simulated and outputted and an actual measurement value in a production line.

Moreover, it is possible to judge excess or deficiency of equipment capacity by comparing an amount of electric power consumption of pieces of equipment running at full capacity and a simulated amount of electric power consumption, thereby making it possible to appropriately set the number of pieces of equipment etc.

Moreover, it is possible to extract, as a piece of equipment that should be noted in considering a reduction of electric power consumption, a piece of equipment that has turned out, as a result of simulation, to consume a relatively large amount of electric power.

Specifically, the types of pieces of equipment set by the virtual model building section 13 include at least one of Type 1 through Type 6.

The simulation apparatus 10 further includes the operating period determining section 15 which determines a period of operation of a piece of equipment (period of equipment operation) on the basis of the number of processes (the number of operations) in the piece of equipment. The first calculating section 181 outputs, for a piece of equipment that has been set to Type 1, the first amount of electric power consumption on the basis of (i) the number of operations (the number of processes) in the piece of equipment and (ii) a period of line operation, which is the longest one among periods of operation of a plurality of pieces of equipment.

The number of operations is the number of operations in an operating state. It is therefore possible to calculate, on the basis of the number of operations, an amount of electric power consumption necessary for the operating state. Meanwhile, the period of line operation is a period covering both a standby state and an operating state. It is therefore possible to calculate, on the basis of the period of line operation, an amount of electric power consumption necessary for both of the standby state and the operating state. Consequently, it is possible to simulate, for a piece of equipment belonging to the Type 1, an amount of electric power consumption in view of a difference in mode of electric power consumption between the standby state and the operating state. With reference to the result thus obtained, it is possible to easily determine equipment specification and layout taking into consideration association (waiting, idle running time) among pieces of line equipment constituting the production line for the purpose of reducing an amount of electric power consumption of the production line.

The standby time determining section 16 generates, for a piece of equipment that has been set to Type 2, standby state information indicative of whether the type of a standby state of the piece of equipment is the first standby state or the second standby state, based on whether a piece of equipment that has been determined to have the longest operating period is preceding or subsequent to the piece of equipment.

Then, the second calculating section 182 outputs, for the piece of equipment belonging to Type 2, the second amount of electric power consumption on the basis of the number of operations (the number of processes), a period of equipment operation (or a period of line operation), a period of standby time, and standby state information.

Consequently, it is possible to simulate, for a piece of equipment belonging to Type 2, an amount of electric power consumption in view of a difference in mode of electric power consumption between the standby state and the operating state. With reference to the result thus obtained, it is possible to easily determine equipment specification and layout taking into consideration association (waiting, idle running time) among pieces of line equipment constituting the production line for the purpose of reducing an amount of electric power consumption of the production line.

The third calculating section 183 outputs, for a piece of equipment that has been set to Type 3, the third amount of electric power consumption on the basis of (i) the fourth fixed amount of unit electric power consumed by the piece of equipment per unit time and (ii) the period of line operation. This makes it possible to output, also for a piece of equipment that is irrelevant to production conditions such as the number of products, an amount of electric power consumption reflecting an operating state of a production line.

The simulation apparatus 10 further includes the schedule setting section 11 which sets a planned period of operation and a planned period of suspension. The virtual model building section 13 sets, for a piece of equipment that has been set to Type 5, (i) a start-up time from a point in time at which the piece of equipment was turned on to a point in time at which the piece of equipment stabilizes and (ii) an amount of start-up electric power consumed during the start-up time. The fifth calculating section 185 determines, for the piece of equipment that has been set to Type 5, whether it can be turned off during a planned period of suspension, on the basis of comparison between the planned period of suspension and a start-up time of the piece of equipment. In a case where the piece of equipment can be turned off, the amount of start-up electric power is outputted as an amount of electric power consumption in the planned period of suspension.

This makes it possible to output an amount of electric power consumed in a planned period of suspension in a case where a piece of equipment is turned off during the planned period of suspension so as to achieve as low electric power consumption as possible. It is therefore possible to easily confirm an effect of the reduction of an amount of electric power consumption by comparison with an amount of electric power consumed in a planned period of suspension in a case where the piece of equipment is kept on during the planned period of suspension.

The virtual model building section 13 sets, for a piece of equipment that has been set to Type 6, a start-up electric power table which shows a relationship of correspondence among (1) a period of suspension of a piece of equipment having temporarily been turned off when it was stable, (2) a required period of start-up time from a point in time at which the piece of equipment was turned on to a point in time at which the piece of equipment again stabilizes at the end of the period of suspension, and (3) the amount of start-up electric power that is consumed during the period of start-up time. The sixth calculating section 186 determines, for the piece of equipment that has been set to Type 6, whether it can be turned off during a planned period of suspension, on the basis of comparison between the planned period of suspension and the start-up time corresponding to the planned period of suspension. In a case where the piece of equipment can be turned off, an amount of start-up electric power corresponding to the planned period of suspension is outputted as an amount of electric power consumption during the planned period of suspension.

This makes it possible to output an amount of electric power consumed in a planned period of suspension in a case where a piece of equipment is turned off in the planned period of suspension so as to achieve as low electric power consumption as possible. It is therefore possible to easily confirm an effect of the reduction of an amount of electric power consumption by comparison with an amount of electric power consumed in a planned period of suspension in a case where the piece of equipment is kept on during the planned period of suspension.

The simulation apparatus 10 further includes the rating section 19 which (i) stores therein in advance a rated electric power table (rated electric power information) in which a total amount of electric power consumption of pieces of equipment excluding the air-conditioning machine (first piece of equipment) 212 is associated with an amount of rated electric power of the air-conditioning machine 212 and (ii) obtains a total amount of electric power consumption outputted for the pieces of equipment excluding the air-conditioning machine 212 and reads out an amount of rated electric power corresponding to the total from the rated electric power table. The third calculating section 183 outputs an amount of electric power consumption of the air-conditioning machine 212 on the basis of the amount of rated electric power thus read out by the rating section 19.

Conventionally, amounts of electric power consumption of the pieces of equipment excluding the air-conditioning machine 212 are calculated on the basis of respective amounts of rated electric power, and an amount of rated electric power of the air-conditioning machine 212 is calculated on the basis of the total of the amounts of electric power consumption thus calculated. In this case, the amounts of electric power consumption of the pieces of equipment excluding the air-conditioning machine 212 are estimated to be higher than actual ones. This is because in actual running, rated electric power is not always consumed. For example, a piece of equipment belonging to Type 1 or 2 consumes less electric power in a standby state. However, according to the arrangement, the rated electric power of the air-conditioning machine 212 can be set to an appropriate one in accordance with amounts of electric power consumption of the other pieces of equipment. This makes it possible to appropriately select an air-conditioning machine 212 having appropriate rated electric power at a production line design stage.

<Modification 1>

The simulation apparatus 10 of one or more embodiments of the present invention simulates an amount of electric power consumption in view of a period of equipment operation and a period of standby time of each piece of equipment. However, in an actual production line, it is necessary to appropriately set timings at which pieces of equipment are turned on, in order to reproduce the simulation by the simulation apparatus 10. Specifically, immediately after start of operation of the production line, a wasteful standby time that is not assumed in the simulation occurs in a case where a piece of line equipment is kept on while it waits for a workpiece conveyed from a preceding piece of line equipment.

Figure 20:
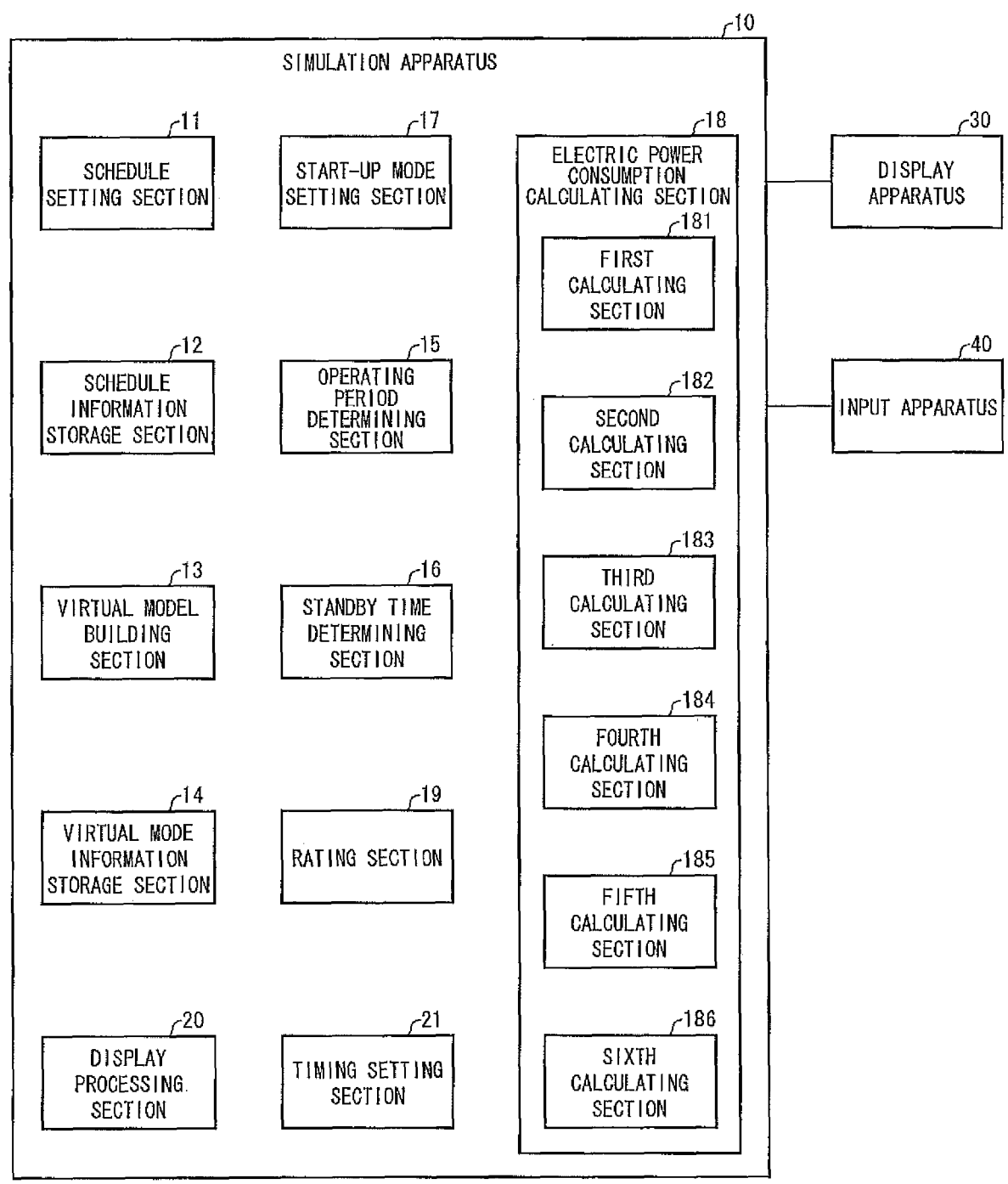
FIG. 20 is a block diagram showing a configuration of a simulation apparatus according to a modification.

On this account, the simulation apparatus 10 may include a timing setting section which determines timings at which pieces of equipment are turned on, as shown in FIG. 20.

The timing setting section sets, for each piece of line equipment, a process time (hereinafter referred to as a takt time) on a piece of workpiece in accordance with user's input.

Note that the timing setting section may cause the display apparatus 30 to display a screen that prompts input of a takt time of each piece of line equipment and may obtain the takt time from the input apparatus 40. Alternatively, the timing setting section may obtain, for pieces of line equipment belonging to Type 1, 2, and 4, the number of operations in a process on a workpiece from the input apparatus 40 and set a takt time on the basis of the following Expression:

(Takt time)=(Unit Operation Electric Power)×(Number of Operations)/Reference Electric Power where the unit operation electric power and the reference electric power are set by the virtual model building section 13.

Note that a user may input "0" as a takt time of a piece of line equipment whose takt time is extremely small. Alternatively, the timing setting section may set "0" as a takt time upon receipt of user's input indicating that a takt time should not be considered.

The timing setting section determines timings at which pieces of line equipment are turned on, on the basis of takt times of the pieces of line equipment. Specifically, the timing setting section sets a start time of each planned period of operation in the schedule information as a timing at which a piece of line equipment given the turn "1" by the virtual model building section 13 is turned on. Moreover, the timing setting section sets a time after elapse of a total of takt times of the piece of line equipment given the turn "1" through a piece of line equipment given the turn "k−1" as a timing at which a piece of line equipment given the turn "k" (k is an integer equal to or larger than 2) is turned on.

Note, however, that the timing setting section sets, as a timing at which a piece of line equipment belonging to Type 5 or 6 is turned on, a time that is earlier by a start-up time than a timing set as described above.

Figure 21:
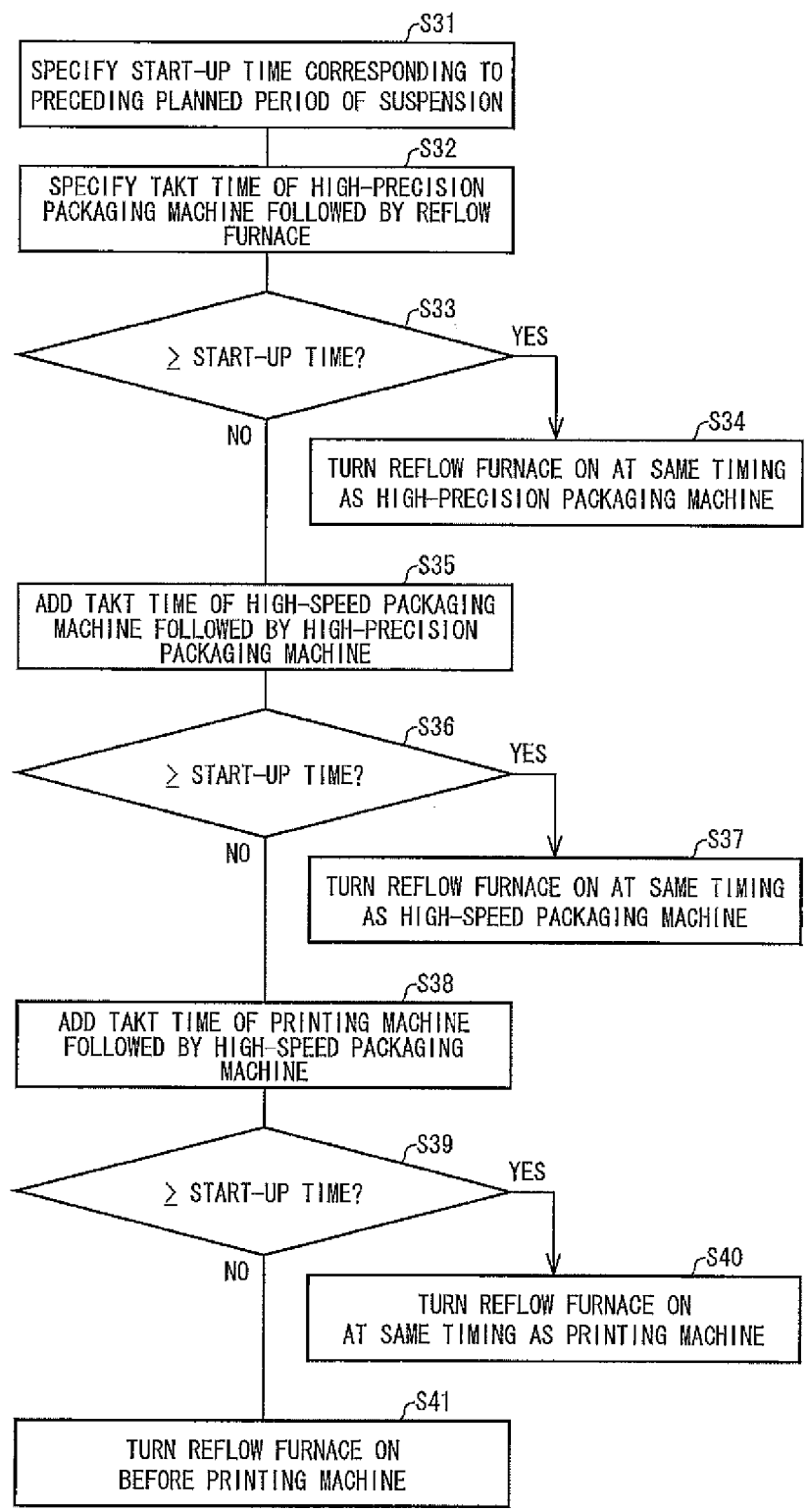
FIG. 21 is a flow chart showing an example of processing of a timing setting section of the simulation apparatus shown in FIG. 20.

Alternatively, the timing setting section may set a timing at which a piece of line equipment belonging to Type 5 or 6 is turned on, in accordance with a flow such as the one shown in FIG. 21. Note that FIG. 21 shows a flow for setting a timing at which the reflow furnace 206 is turned on, in a case where a takt time of the first inspection machine 202 and a takt time of the second inspection machine 205 are set to "0" in the virtual model shown in FIG. 1.

First, the timing setting section specifies, for each planned period of operation, duration of a planned period of suspension preceding the planned period of operation with reference to the schedule information, and reads out a period of start-up time corresponding to the duration thus specified (S31).

Next, the timing setting section specifies a takt time of the high-precision packaging machine 204, which is a piece of line equipment followed by the reflow furnace 206 (S32). Then, the timing setting section compares the takt time specified in S32 with the start-up time read out in S31 (S33). In a case where the takt time is equal to or longer than the start-up time (Yes in S33), the timing setting section sets a timing at which the reflow furnace 206 is turned on so that it coincides with a timing at which the high-precision packaging machine 204 is turned on (S34).

Meanwhile, in a case where the takt time is shorter than the start-up time (No in S33), the timing setting section specifies a takt time of the high-speed packaging machine 203, which is a piece of line equipment followed by the high-precision packaging machine 204, and adds this takt time to the takt time specified previously (in this case, the takt time specified in S32) (S35). Then, the timing setting section compares the total of the takt times obtained in S35 with the start-up time read out in S31 (S36). In a case where the total of the takt times is equal to or longer than the start-up time (Yes in S36), the timing setting section sets a timing at which the reflow furnace 206 is turned on so that it coincides with a timing at which the high-speed packaging machine 203 is turned on (S37).

Meanwhile, in a case where the total of the takt times is shorter than the start-up time (No in S36), the timing setting section specifies a takt time of the printing machine 201, which is a piece of line equipment followed by the high-speed packaging machine 203, and adds this takt time to the total of the takt times obtained previously (in this case, the takt times obtained in S36) (S38). Then, the timing setting section compares the total of the takt times obtained in S38 with the start-up time read out in S31 (S39). In a case where the total of the takt times is equal to or longer than the start-up time (Yes in S39), the timing setting section sets a timing at which the reflow furnace 206 is turned on so that it coincides with a timing at which the printing machine 201 is turned on (S40).

In a case where the total of the takt times is shorter than the start-up time (No in S39), the timing setting section sets the timing at which the reflow furnace 206 is turned on so that it precedes, by a time obtained by subtracting the total of the takt times obtained in S38 from the start-up time read out in S31, the timing at which the printing machine 201 is turned on.

As described above, in the present modification, the simulation apparatus 10 for simulation in a virtual model of a production line (system) in which a plurality of pieces of line equipment sequentially carry out processes includes the timing setting section which sets takt times of the respective pieces of line equipment and sets timings at which the respective pieces of line equipment are turned on, on the basis of the takt times thus set.

Specifically, the timing setting section sets, as a turn-on timing of a k-th piece of line equipment, a timing (provisional timing) obtained by adding a takt time of a (k−1)th piece of line equipment to a turn-on timing of the (k−1)th piece of line equipment.

Note, however, that in a case where the k-th piece of line equipment belongs to Type 5 or 6, the timing setting section sets, as the turn-on timing of the k-th piece of line equipment, a timing that is earlier than the provisional timing by a start-up time of the k-th piece of line equipment. Alternatively, the timing setting section calculates minimum m which satisfies the following: the start-up time of the k-th piece of line equipment is equal to or shorter than a total of takt times of (k−m)th through (k−1)th pieces of line equipment. Then, the timing setting section may set, as the turn-on timing of the k-th piece of line equipment, a provisional timing of the (k−m)th piece of line equipment.

This makes it possible to appropriately set a timing of turn-on (turn-on timing) of a piece of line equipment belonging to Type 5 or 6 in accordance with operating states of other pieces of line equipment. As a result, it is possible to easily grasp turn-on timings which do not permit occurrence of wasteful electric power consumption. This is useful in design of a production line.

<Modification 2>

In the above description, the operating period determining section 15 is configured to determine, for each piece of line equipment belonging to Type 1, 2, or 4, a period of equipment operation on the basis of an amount of reference electric power, the number of operations, and an amount of unit operation electric power. However, the operating period determining section 15 may be configured to determine, also for each piece of line equipment belonging to Type 1, 2, or 4, a period of equipment operation on the basis of the number of workpieces to be inputted and the maximum number of workpieces to be processed, as with each piece of line equipment belonging to Type 3. In this case, the virtual model building section 13 sets, for each piece of line equipment belonging to Type 1, 2, or 4, the number of workpieces to be inputted and the maximum number of workpieces to be processed, in accordance with user's input.

In this case, the first calculating section 181 can calculate the first amount of electric power consumption according to the following Expression (1'):

(First Amount of Electric Power Consumption)= {(Number of Workpieces To Be Inputted)/ (Maximum Number of Workpieces To Be Processed)}/(Amount of Reference Electric Power)+((Period of Line Operation)×(First Fixed Amount of Unit Electric Power))    Expression (1').

The first term on the right side of Expression (1') indicates an amount of electric power that needs to be consumed only in an operating state, and the second term on the right side of Expression (1') indicates an amount of electric power that needs to be consumed both in a standby state and an operating state. As described above, the first calculating section 181 outputs, for a piece of line equipment that has been set to Type 1, the first amount of electric power consumption on the basis of the number of processes (i.e. the number of operations and the number of workpieces to be inputted) in the piece of line equipment and the period of line operation, as in the Expression (1).

Similarly, the second calculating section 182 can calculate the second amount of electric power consumption by replacing the first term on the right side of the Expressions (2-1) through (2-5) with {(Number of Workpieces To Be Inputted)/(Maximum Number of Workpieces To Be Processed)}/ (Amount of Reference Electric Power).

Similarly, the fourth calculating section 184 can calculate the fourth amount of electric power consumption by replacing the right side of the Expression (4) with {(Number of Workpieces To Be Inputted)/(Maximum Number of Workpieces To Be Processed)}/(Amount of Reference Electric Power).

<Other Remarks>

In the above description, the types set by the virtual model building section 13 are classified into the following Type 1 through Type 6.

Type 1: Mode of electric power consumption in a piece of equipment that varies in electric power consumption between (i) a standby state in which it stands by due to a delay of processing of another piece of equipment and (ii) an operating state Type 2: Mode of electric power consumption in a piece of equipment which varies in electric power consumption among (i) a first standby state in which it stands by due to a delay of processing of a preceding piece of equipment, (ii) a second standby state in which it stands by due to a delay of processing of a next piece of equipment, and (iii) an operating state Type 3: Mode of electric power consumption in a piece of equipment which consumes a substantially constant amount of electric power regardless of a delay in processing of another piece of equipment Type 4: Mode of electric power consumption in a piece of equipment which consumes electric power only during operation thereof.

Type 5: Mode of electric power consumption in a piece of equipment which (i) takes a predetermined start-up time from a point in time at which the piece of equipment is turned on to a point in time at which the piece of equipment stabilizes and (ii) consumes a substantially constant amount of electric power during the predetermined start-up time, the fifth type being a mode of electric power consumption from the point in time at which the piece of equipment is turned on to the point in time at which the piece of equipment stabilizes Type 6: Mode of electric power consumption in a piece of equipment which (i) takes a predetermined start-up time from a point in time at which the piece of equipment is turned on to a point in time at which the piece of equipment stabilizes and (ii) varies in the start-up time depending on a state in which the piece of equipment was before the turn-on, the sixth type being a mode of electric power consumption from the point in time at which the piece of equipment is turned on to the point in time at which the piece of equipment stabilizes.

Note, however, that it is only necessary that the types set by the virtual model building section 13 include at least one of the Type 1 through Type 6.

The "production line" as used herein refers to a system in which processes such as processing, assembling, and inspection are carried out on a workpiece, and is not limited to a line in which a plurality of pieces of equipment are aligned. For example, the "production line" as used herein may be a production line in which whole steps are achieved by pieces of equipment installed on the first floor of a building and pieces of equipment installed on the second floor of the building or may be a production line in which whole steps are achieved by all of a plurality of pieces of equipment distributed over a plurality of buildings.

The above description describes one or more embodiments of the present invention by taking a production line as an example. Note, however, that the present invention is not limited to a production line, and can be applicable also to an inspection line, a sorting line for sorting out goods in a delivery center, or the like.

The present invention is not limited to a line, and can be applicable also to a system including a plurality of pieces of equipment that operate in association with each other. For example, one or more embodiments of the present invention is applicable to a management system for managing steps of processing objects. Note that the steps of processing objects are, for example, steps of inspecting industrial products, agricultural products, or raw materials, steps of processing waste (e.g. industrial waste, industrial wastewater, waste gas, garbage), steps of inspecting waste, steps of inspecting pieces of equipment, or recycling steps. Such a management system also includes a plurality of pieces of equipment that exhibit modes of electric power consumption of various types such as Type 1 and Type 2 since the plurality of pieces of equipment sequentially carry out processes.

One example of such a management system is a purification system for processing industrial wastewater or domestic wastewater. In this case, the management system, in which a plurality of wastewater tanks A through D are provided, includes, as pieces of purification equipment, a first pump which sends wastewater from the wastewater tank A to the wastewater tank B via a first filter, a second pump which sends wastewater from the wastewater tank B to the wastewater tank C via a second filter, and a second pump which sends wastewater from the wastewater tank C to the wastewater tank D via a third filter. In a case where a process of the third pump is delayed, the second pump enters a standby state so that wastewater does not spill out of the wastewater tank C. Note, however, that there is a case where the second pump is caused to operate at lower electric power consumption than usual for some reason (e.g. for the purpose of prevention of backflow) even in the standby state. In this case, the second pump is a piece of equipment that exhibits a mode of electric power consumption of the Type 1.

As described above, a simulation apparatus according to one or more embodiments of the present invention includes a type setting section setting a type of mode of electric power consumption of equipment; and an output section simulating an amount of the electric power consumption of the equipment in accordance with the type set by the type setting section and outputting the amount of electric power consumption thus simulated.

This makes it possible to simulate and output an amount of electric power consumption of equipment in accordance with a mode of electric power consumption of the equipment. It is therefore possible to accurately simulate electric power consumption.

The simulation apparatus according to one or more embodiments of the present invention is arranged such that the equipment is a plurality of pieces of equipment included in a system; and the output section simulates amounts of electric power consumption of the plurality of pieces of equipment and outputs the amounts of electric power consumption thus simulated.

This makes it possible to simulate, for each piece of equipment, an amount of electric power consumption according to a mode thereof and output the amount of electric power consumption thus simulated. It is therefore possible to highly accurately simulate an amount of electric power consumption.

Note that the types set by the type setting section are classified into the following first type through sixth type.

First type: Mode of electric power consumption in a piece of equipment that varies in electric power consumption between (i) a standby state in which it stands by due to a delay of processing of another piece of equipment and (ii) an operating state Second type: Mode of electric power consumption in a piece of equipment which varies in electric power consumption among (i) a first standby state in which it stands by due to a delay of processing of a preceding piece of equipment, (ii) a second standby state in which it stands by due to a delay of processing of a next piece of equipment, and (iii) an operating state Third type: Mode of electric power consumption in a piece of equipment which consumes a substantially constant amount of electric power regardless of a delay in processing of another piece of equipment Fourth type: Mode of electric power consumption in a piece of equipment which consumes electric power only during operation thereof.

Fifth type: Mode of electric power consumption in a piece of equipment which (i) takes a predetermined start-up time from a point in time at which the piece of equipment is turned on to a point in time at which the piece of equipment stabilizes and (ii) consumes a substantially constant amount of electric power during the predetermined start-up time, the fifth type being a mode of electric power consumption from the point in time at which the piece of equipment is turned on to the point in time at which the piece of equipment stabilizes Sixth type: Mode of electric power consumption in a piece of equipment which (i) takes a predetermined start-up time from a point in time at which the piece of equipment is turned on to a point in time at which the piece of equipment stabilizes and (ii) varies in the start-up time depending on a state in which the piece of equipment was before the turn-on, the sixth type being a mode of electric power consumption from the point in time at which the piece of equipment is turned on to the point in time at which the piece of equipment stabilizes.

The simulation apparatus according to one or more embodiments of the present invention is arranged to further include an operating period determining section determining a period of operation of each of the plurality of pieces of equipment on a basis of the number of processes in the each of the plurality of pieces of equipment, the output section (i) simulating an amount of electric power consumption by a piece of equipment of the first type on a basis of the number of processes in the piece of equipment and a longest one of the periods of operations of the plurality of pieces of equipment that have been determined by the operating period determining section and (ii) outputting the amount of electric power consumption thus simulated.

According to the arrangement, an amount of electric power consumption required for an operating state of a piece of equipment can be calculated on the basis of the number of processes in the piece of equipment. The longest period of operation is a period of time which includes both a standby state and an operating state. It is therefore possible to calculate, on the basis of the longest period of operation, an amount of electric power consumption required both in the standby state and in the operating state. Consequently, it is possible to simulate, for a piece of equipment belonging to the first type, an amount of electric power consumption taking into consideration a difference in mode of electric power consumption between a standby state and an operating state.

The simulation apparatus according to one or more embodiments of the present invention is arranged to further include: an operating period determining section determining a period of operation of each of the plurality of pieces of equipment on a basis of the number of processes in the each of the plurality of pieces of equipment; and a standby time determining section (i) determining a period of standby time of a piece of equipment of the second type, the period of standby time being a difference between a period of operation of the piece of equipment of the second type and a longest one of the periods of operation of the plurality of pieces of equipment that have been determined by the operating period determining section and (ii) generating standby state information indicating whether a type of standby state in the period of standby time is the first standby state or the second standby state, on a basis of whether a piece of equipment whose period of operation is longest is a preceding or subsequent piece of equipment, the output section (i) simulating an amount of electric power consumption of the piece of equipment of the second type on a basis of the number of processes in the piece of equipment, the period of operation determined for the piece of equipment, the period of standby time determined for the piece of equipment, and the standby state information and (ii) outputting the amount of electric power consumption thus simulated.

According to the arrangement, it is possible to calculate, on the basis of the number of processes, an amount of electric power consumption required for an operating state. Moreover, it is possible to calculate, on the basis of the standby state information, an amount of electric power consumption for a standby state according to a type of the standby state. Moreover, it is possible to calculate, on the basis of a period of operation and a period of standby time, electric power consumption required both in a standby state and in an operating state. Consequently, it is possible to simulate, for a piece of equipment belonging to the second type, an amount of electric power consumption taking into consideration a difference in mode of electric power consumption between a standby state and an operating state.

Note that the longest period of operation is a total of a period of operation and a period of standby time. Accordingly, in a case where an amount of electric power consumption required both in a standby state and an operating state is calculated with the use of the longest period of operation, the amount of electric power consumption is outputted on the basis of a period of operation and a period of standby time.

The simulation apparatus according to one or more embodiments of the present invention is arranged to further include an operating period determining section determining a period of operation of each of the plurality of pieces of equipment on a basis of the number of processes in the each of the plurality of pieces of equipment, the output section (i) simulating an amount of electric power consumption of a piece of equipment of the third type on a basis of an amount of electric power consumed per unit time by the piece of equipment and a longest one of the periods of operation of the plurality of pieces of equipment that have been determined by the operating period determining section and (ii) outputting the amount of electric power consumption thus simulated.

According to the arrangement, it is possible to output, for a piece of equipment of the third type, an amount of electric power consumption reflecting operating states of other pieces of equipment.

The simulation apparatus according to one or more embodiments of the present invention is arranged to further include a schedule setting section setting a planned period of operation and a planned period of suspension of the system, the type setting section setting, for a piece of equipment of the fifth type, (i) a start-up time, which is a period of time from a point in time at which the piece of equipment is turned on to a point in time at which the piece of equipment stabilizes, and (ii) an amount of start-up electric power, which is an amount of electric power consumed during the start-up time, the output section determining whether the piece of equipment of the fifth type can be turned off during the planned period of suspension set by the schedule setting section, on a basis of comparison between the planned period of suspension and the start-up time of the piece of equipment of the fifth type and, in a case where it is determined that the piece of equipment of the fifth type can be turned off during the planned period of suspension, the output section outputting, as an amount of electric power consumption during the planned period of suspension, the amount of the start-up electric power corresponding to the piece of equipment of the fifth type.

According to the arrangement, it is possible to output an amount of electric power consumed in a planned period of suspension in a case where a piece of equipment is turned off in the planned period of suspension so as to achieve as low electric power consumption as possible. It is therefore possible to easily confirm an effect of the reduction of an amount of electric power consumption by comparison with an amount of electric power consumed in a planned period of suspension in a case where the piece of equipment is kept on during the planned period of suspension.

The simulation apparatus according to one or more embodiments of the present invention is arranged to further include a schedule setting section setting a planned period of operation and a planned period of suspension of the system, the type setting section setting, for a piece of equipment of the sixth type, start-up electric power information showing correspondence among (1) a period of suspension of the piece of equipment having temporarily been turned off in a stable state, (2) a required period of start-up time from a point in time at which the piece of equipment is turned on to a point in time at which the piece of equipment again stabilizes at end of the period of suspension, and (3) an amount of electric power that is consumed during the period of start-up time, and the output section determining whether the piece of equipment of the sixth type can be turned off during the planned period of suspension set by the schedule setting section, on a basis of comparison between the planned period of suspension and the start-up time corresponding to the planned period of suspension, and in a case where it is determined that the piece of equipment of the sixth type can be turned off during the planned period of suspension, the output section outputting, as an amount of electric power consumption during the planned period of suspension, an amount of start-up electric power corresponding to the planned period of suspension.

According to the arrangement, it is possible to output an amount of electric power consumed in a planned period of suspension in a case where a piece of equipment is turned off during the planned period of suspension so as to achieve as low electric power consumption as possible. It is therefore possible to easily confirm an effect of the reduction of an amount of electric power consumption by comparison with an amount of electric power consumed in a planned period of suspension in a case where the piece of equipment is kept on during the planned period of suspension.

The simulation apparatus according to one or more embodiments of the present invention is arranged to further include a rating section which stores therein in advance rated electric power information showing correspondence between (i) a total of amounts of electric power consumption of the plurality of pieces of equipment excluding a first piece of equipment and (ii) an amount of rated electric power of the first piece of equipment, the rating section reading out, from the rated electric power information, an amount of rated electric power corresponding to the total of the amounts of electric power consumption outputted by the output section for the plurality of pieces of equipment excluding the first piece of equipment, and the output section outputting an amount of electric power consumption of the first piece of equipment on the basis of the amount of the rated electric power read out by the rating section.

Figure 23:
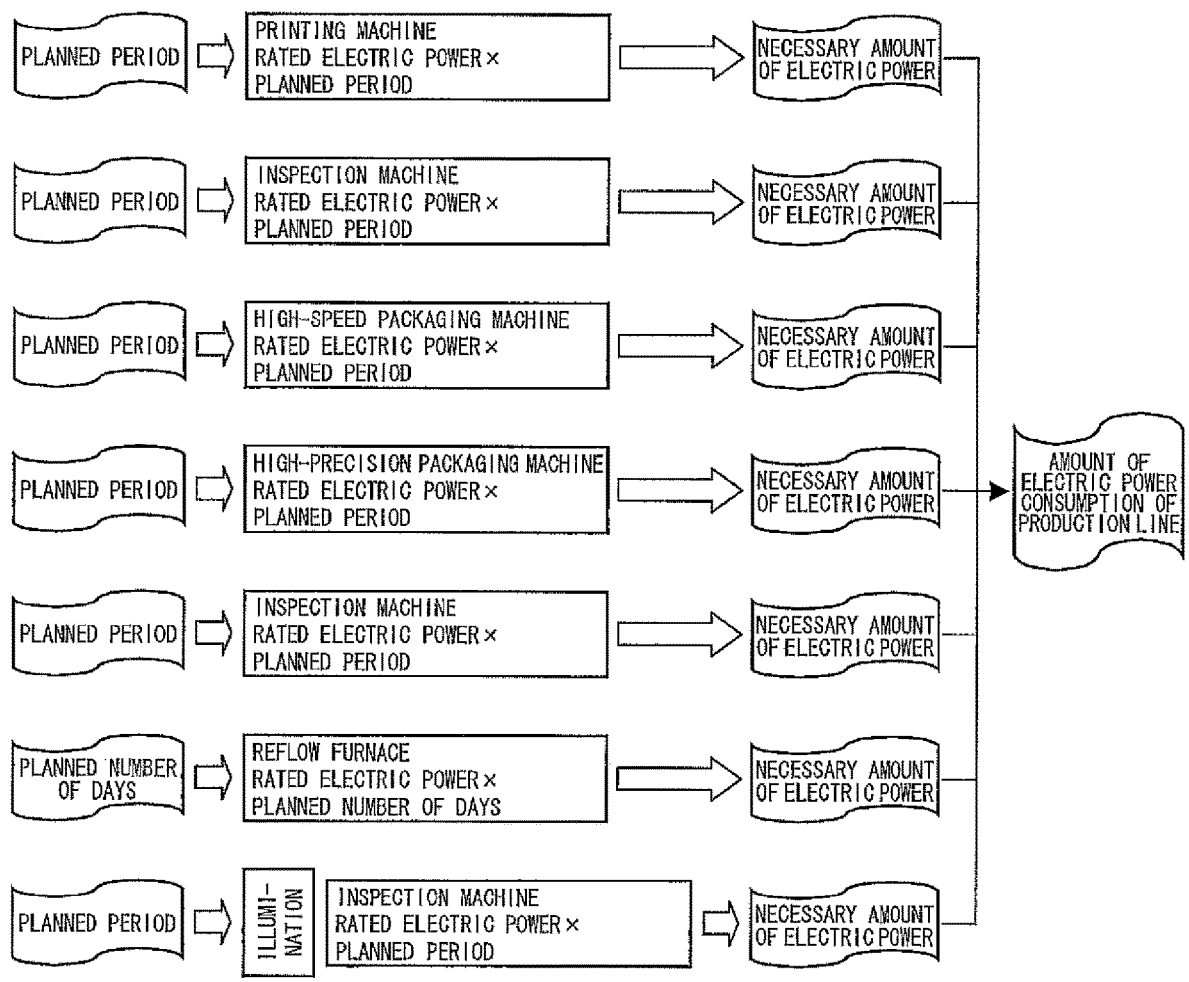
FIG. 23 is a view showing a reference example of a method for simulating an amount of electric power consumption of a production line.

Conventionally, rated electric power of the first piece of equipment is obtained from a total of amounts of electric power consumption of the pieces of equipment excluding the first piece of equipment which are obtained on the basis of rated electric power as shown in FIG. 23. In this case, the amounts of electric power consumption of the pieces of equipment excluding the first piece of equipment is estimated to be higher than actual ones. This is because in actual running, rated electric power is not always consumed. For example, a piece of equipment belonging to the first type of the second type consumes less electric power in a standby state.

However, according to the arrangement, it is possible to appropriately set an amount of rated electric power of the first piece of equipment in accordance with an amount of electric power consumption simulated in consideration of mode of electric power consumption of other pieces of equipment.

A simulation method according to one or more embodiments of the present invention for simulating amounts of electric power consumed by a plurality of pieces of equipment included in a system and outputting the amounts of electric power thus simulated, includes the steps of: setting a type of mode of electric power consumption in each of the plurality of pieces of equipment; and outputting an amount of electric power consumption of the each of the plurality of pieces of equipment in accordance with the type thus set. According to the arrangement, it is possible to produce substantially similar effect as those described above.

The present invention is not limited to the description of the embodiments above, but may be altered by a skilled person within the scope of the claims. An embodiment based on a proper combination of technical means disclosed in different embodiments is encompassed in the technical scope of the present invention.

Note that each section of the simulation apparatus 10 in each of the embodiments may be realized in such a manner that computing means such as a CPU (Central Processing Unit) executes a program stored in storage means such as a ROM (Read Only Memory) or a RAM (Random Access Memory) and controls input means such as a keyboard, output means such as a display, or communication means such as an interface circuit. Accordingly, various functions and various processes of a production line management apparatus of one or more embodiments of the present invention can be achieved just by causing a computer having these means to read a storage medium in which the program is stored and execute the program. Moreover, in a case where the program is stored in a removable storage medium, the various functions and the various processes can be achieved on any computer.

The storage medium may be a memory (not shown), such as a ROM, for processing in a microcomputer. Alternatively, the storage medium may be a program medium that can read by inserting the storage medium into a program reading device provided as an external storage device (not shown).

In either case, according to one or more embodiments of the present invention, the stored program is arranged to be accessible to a microprocessor that will execute the program. Furthermore, according to one or more embodiments of the present invention, the program is arranged to be read, downloaded to a program storage area (not shown) of the microcomputer, and then executed. It is assumed that the download program is stored in advance in the main apparatus.

It should be noted here that the program medium is a storage medium arranged to be separable from the main body. The storage medium may be, for example, a tape, such as a magnetic tape or a cassette tape; a magnetic disk, such as a flexible disk or a hard disk, or a disk, such as CD/MO/MD/DVD; a card, such as an IC card (memory card); or a semiconductor memory, such as a mask ROM/EPROM (erasable programmable read-only memory)/EEPROM (electrically erasable programmable read-only memory)

(Registered Trademark)/flash ROM. All these storage media hold a program in a fixed manner.

In a case of a system configuration connectable to communication networks including the Internet, according to one or more embodiments of the present invention, the program medium is a medium carrying the program in a flowing manner as in the downloading of a program over a communication network.

Further, when the program is downloaded over a communications network in this manner, according to one or more embodiments of the present invention, the download program is stored in advance in the main apparatus or installed from another storage medium.

One or more embodiments of the present invention is, for example, applicable to a system including a plurality of pieces of equipment. The system is, for example, a production line, an inspection line, a sorting line, waste disposal system, or a wastewater purification system.

REFERENCE SIGNS LIST

10: Simulation apparatus
11: Schedule setting section
12: Schedule information storage section
13: Virtual model building section (type setting section)
14: Virtual mode information storage section
15: Operating period determining section
16: Standby time determining section
17: Start-up mode setting section
18: Electric power consumption calculating section (output section)
19: Rating section
20: Display processing section
30: Display apparatus
40: Input apparatus
181: First calculating section (output section)
182: Second calculating section (output section)
183: Third calculating section (output section)
184: Fourth calculating section (output section)
185: Fifth calculating section (output section)
186: Sixth calculating section (output section)
200: Virtual model
201: Printing machine (equipment)
202: First inspection machine (equipment)
203: High-speed packaging machine (equipment)
204: High-precision packaging machine (equipment)
205: Second inspection machine (equipment)
206: Reflow furnace (equipment)
207: Third inspection machine (equipment)
208: Illuminator (equipment)
211: Air compressor (equipment)
212: Air-conditioning machine (first piece of equipment)
213: Exhaust duct (equipment)

The invention claimed is:

1. A simulation apparatus, comprising:
a memory, and
a central processing unit (CPU),
wherein the CPU builds a virtual model of a production line based on an information including (a) equipment identification information for identifying each piece of equipment out of a plurality of pieces of equipment included in the virtual model, (b) a number of pieces of equipment, (c) mode type information that indicates a type of mode of electric power consumption of each piece of equipment out of the plurality of pieces of equipment, (d) equipment type information that indicates whether a piece of equipment out of the plurality of pieces of equipment is a piece of line equipment or a piece of supporting equipment, and (e) an order in which pieces of line equipment take turns to perform processes on an object to be processed,
wherein pieces of line equipment are pieces of equipment that vary in electric power consumption between an operating state in which a process is performed on the object to be processed and a standby state in which the piece stands by without performing the process on the object to be processed,
wherein the CPU sets the type of mode of electric power consumption of a piece of equipment included in a plurality of pieces of equipment in a system, the plurality of pieces of equipment operating in association with each other and sequentially carrying out processes,
wherein the CPU simulates an amount of the electric power consumption of the piece of equipment in accordance with the type set by the CPU and outputs the amount of electric power consumption thus simulated,
wherein the type set by the CPU includes a first type which is a mode of electric power consumption in a piece of equipment that varies in electric power consumption between:
(i) a standby state in which it stands by due to a delay of processing of another piece of equipment and
(ii) an operating state,
wherein a time duration of the standby state is variable and the time duration is determined based on the type of mode of electric power consumption of each piece of equipment included in the plurality of pieces of equipment in a system, and
wherein the simulated amount of electric power consumption output by the CPU is used to determine a specification and a layout of the piece of equipment in association with the plurality of pieces of equipment in the system.

2. The simulation apparatus according to claim 1,
wherein the CPU simulates amounts of electric power consumption of the plurality of pieces of equipment and outputs the amounts of electric power consumption thus simulated.

3. The simulation apparatus according to claim 2, wherein the type set by the CPU includes a second type which is a mode of electric power consumption in a piece of equipment which varies in electric power consumption among
(i) a first standby state in which it stands by due to a delay of processing of a preceding piece of equipment,
(ii) a second standby state in which it stands by due to a delay of processing of a next piece of equipment, and
(iii) the operating state.

4. The simulation apparatus according to claim 3,
wherein the CPU further determines a period of operation of each of the plurality of pieces of equipment on a basis of the number of processes in the each of the plurality of pieces of equipment,
wherein the CPU
(i) determines a period of standby time of a piece of equipment of the second type, the period of standby time being a difference between a period of operation of the piece of equipment of the second type and a longest one of the periods of operation of the plurality of pieces of equipment that have been determined by the CPU and
(ii) generates standby state information indicating whether a type of standby state in the period of standby time is the first standby state or the second standby state, on a basis of whether a piece of equipment whose period of operation is longest is a preceding or subsequent piece of equipment, and wherein the CPU
- (i) simulates an amount of electric power consumption of the piece of equipment of the second type on a basis of the number of processes in the piece of equipment, the period of operation determined for the piece of equipment, the period of standby time determined for the piece of equipment, and the standby state information and
- (ii) outputs the amount of electric power consumption thus simulated.

5. The simulation apparatus according to claim 2, wherein the type set by the CPU includes a third type which is a mode of electric power consumption in a piece of equipment which consumes a substantially constant amount of electric power.

6. The simulation apparatus according to claim 5,
wherein the CPU further determines a period of operation of each of the plurality of pieces of equipment on a basis of the number of processes in the each of the plurality of pieces of equipment, and wherein the CPU
- (i) simulates an amount of electric power consumption of a piece of equipment of the third type on a basis of an amount of electric power consumed per unit time by the piece of equipment and a longest one of the periods of operation of the plurality of pieces of equipment that have been determined by the CPU and
- (ii) outputs the amount of electric power consumption thus simulated.

7. The simulation apparatus according to claim 2, wherein the type set by the CPU includes a fourth type which is a mode of electric power consumption in a piece of equipment which consumes electric power only during operation thereof.

8. The simulation apparatus according to claim 2, wherein the type set by the CPU includes a fifth type which is a mode of electric power consumption in a piece of equipment which
- (i) takes a predetermined start-up time from a point in time at which the piece of equipment is turned on to a point in time at which the piece of equipment stabilizes and
- (ii) consumes a substantially constant amount of electric power during the predetermined start-up time, the fifth type being a mode of electric power consumption from the point in time at which the piece of equipment is turned on to the point in time at which the piece of equipment stabilizes.

9. The simulation apparatus according to claim 8,
wherein the CPU further sets a planned period of operation and a planned period of suspension of the system,
wherein the CPU sets, for a piece of equipment of the fifth type,
- (i) a start-up time, which is a period of time from a point in time at which the piece of equipment is turned on to a point in time at which the piece of equipment stabilizes, and
- (ii) an amount of start-up electric power, which is an amount of electric power consumed during the start-up time, wherein the CPU determines whether the piece of equipment of the fifth type can be turned off during the planned period of suspension set by the CPU, on a basis of comparison between the planned period of suspension and the start-up time of the piece of equipment of the fifth type, and wherein in a case where it is determined that the piece of equipment of the fifth type can be turned off during the planned period of suspension, the CPU outputs, as an amount of electric power consumption during the planned period of suspension, the amount of the start-up electric power corresponding to the piece of equipment of the fifth type.

10. The simulation apparatus according to claim 2, wherein the type set by the CPU includes a sixth type which is a mode of electric power consumption in a piece of equipment which
- (i) takes a predetermined start-up time from a point in time at which the piece of equipment is turned on to a point in time at which the piece of equipment stabilizes and
- (ii) varies in the start-up time depending on a state in which the piece of equipment was before the turn-on, the sixth type being a mode of electric power consumption from the point in time at which the piece of equipment is turned on to the point in time at which the piece of equipment stabilizes.

11. The simulation apparatus according to claim 10,
wherein the CPU further sets a planned period of operation and a planned period of suspension of the system,
wherein the CPU sets, for a piece of equipment of the sixth type, start-up electric power information showing correspondence among (1) a period of suspension of the piece of equipment having temporarily been turned off in a stable state, (2) a required period of start-up time from a point in time at which the piece of equipment is turned on to a point in time at which the piece of equipment again stabilizes at end of the period of suspension, and (3) an amount of electric power that is consumed during the period of start-up time,
wherein the CPU determines whether the piece of equipment of the sixth type can be turned off during the planned period of suspension set by the CPU, on a basis of comparison between the planned period of suspension and the start-up time corresponding to the planned period of suspension, and
wherein in a case where it is determined that the piece of equipment of the sixth type can be turned off during the planned period of suspension, the CPU outputs, as an amount of electric power consumption during the planned period of suspension, an amount of start-up electric power corresponding to the planned period of suspension.

12. The simulation apparatus according to claim 2,
wherein the CPU further stores therein in advance rated electric power information showing correspondence between
- (i) a total of amounts of electric power consumption of the plurality of pieces of equipment excluding a first piece of equipment and
- (ii) an amount of rated electric power of the first piece of equipment, wherein the CPU reads out, from the rated electric power information, an amount of rated electric power corresponding to the total of the amounts of electric power consumption outputted by the CPU for the plurality of pieces of equipment excluding the first piece of equipment, and wherein the CPU outputs an amount of electric power consumption of the first piece of equipment on the basis of the amount of the rated electric power read out by the CPU.

13. The simulation apparatus according to claim 1,
wherein the CPU further determines a period of operation of each of the plurality of pieces of equipment on a basis of the number of processes in the each of the plurality of pieces of equipment, and
wherein the CPU
  (i) simulates an amount of electric power consumption by a piece of equipment of the first type on a basis of the number of processes in the piece of equipment and a longest one of the periods of operations of the plurality of pieces of equipment that have been determined by the CPU and
  (ii) outputs the amount of electric power consumption thus simulated.

14. A method for simulating amounts of electric power consumed by a plurality of pieces of equipment included in a system and outputting the amounts of electric power thus simulated, comprising:
  building a virtual model of a production line based on an information including (a) equipment identification information for identifying each piece of equipment out of a plurality of pieces of equipment included in the virtual model, (b) a number of pieces of equipment, (c) mode type information that indicates a type of mode of electric power consumption of each piece of equipment out of the plurality of pieces of equipment, (d) equipment type information that indicates whether a piece of equipment out of the plurality of pieces of equipment is a piece of line equipment or a piece of supporting equipment, and (e) an order in which pieces of line equipment take turns to perform processes on an object to be processed,
    wherein pieces of line equipment are pieces of equipment that vary in electric power consumption between an operating state in which a process is performed on the object to be processed and a standby state in which the piece stands by without performing the process on the object to be processed,
  setting the type of mode of electric power consumption in each of the plurality of pieces of equipment; and
  outputting an amount of electric power consumption of the each of the plurality of pieces of equipment in accordance with the type thus set,
  the plurality of pieces of equipment operating in association with each other and sequentially carrying out processes,
  wherein a time duration of the standby state is variable and the time duration is determined based on the type of mode of electric power consumption of each piece of equipment included in the plurality of pieces of equipment in a system,
  wherein the outputted simulated amounts of electric power are used to determine a specification and layout of each of the plurality of pieces of equipment in association with each other in the system, and
  wherein the type set by the CPU includes a first type which is a mode of electric power consumption in a piece of equipment that varies in electric power consumption between:
    (i) a standby state in which it stands by due to a delay of processing of another piece of equipment and
    (ii) an operating state.

15. A non-transitory computer-readable recording medium in which a program executed on a computer that simulates amounts of electric power consumed by a plurality of pieces of equipment included in a system and outputs the amounts of electric power thus simulated, the program causing the computer to perform:
  building a virtual model of a production line based on an information including (a) equipment identification information for identifying each piece of equipment out of a plurality of pieces of equipment included in the virtual model, (b) a number of pieces of equipment, (c) mode type information that indicates a type of mode of electric power consumption of each piece of equipment out of the plurality of pieces of equipment, (d) equipment type information that indicates whether a piece of equipment out of the plurality of pieces of equipment is a piece of line equipment or a piece of supporting equipment, and (e) an order in which pieces of line equipment take turns to perform processes on an object to be processed,
    wherein pieces of line equipment are pieces of equipment that vary in electric power consumption between an operating state in which a process is performed on the object to be processed and a standby state in which the piece stands by without performing the process on the object to be processed,
  setting the type of mode of electric power consumption in each of the plurality of pieces of equipment; and
  outputting an amount of electric power consumption of the each of the plurality of pieces of equipment in accordance with the type thus set,
  the plurality of pieces of equipment operating in association with each other and sequentially carrying out processes,
  wherein a time duration of the standby state is variable and the time duration is determined based on the type of mode of electric power consumption of each piece of equipment included in the plurality of pieces of equipment in a system,
  wherein the outputted simulated amounts of electric power are used to determine a specification and layout of each of the plurality of pieces of equipment in association with each other in the system, and
  wherein the type set by the CPU includes a first type which is a mode of electric power consumption in a piece of equipment that varies in electric power consumption between:
    (i) a standby state in which it stands by due to a delay of processing of another piece of equipment and
    (ii) an operating state.

* * * * *